US010564698B2

(12) United States Patent
Okamoto et al.

(10) Patent No.: US 10,564,698 B2
(45) Date of Patent: Feb. 18, 2020

(54) METHOD FOR CONTROLLING POWER SUPPLY IN SEMICONDUCTOR DEVICE

(71) Applicant: Semiconductor Energy Laboratory Co., Ltd., Atsugi-shi, Kanagawa-ken (JP)

(72) Inventors: Yuki Okamoto, Kanagawa (JP); Yoshiyuki Kurokawa, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 213 days.

(21) Appl. No.: 15/677,181

(22) Filed: Aug. 15, 2017

(65) Prior Publication Data

US 2018/0052508 A1 Feb. 22, 2018

(30) Foreign Application Priority Data

Aug. 19, 2016 (JP) .................... 2016-161049

(51) Int. Cl.
*G06F 1/00* (2006.01)
*G06F 1/3234* (2019.01)
(Continued)

(52) U.S. Cl.
CPC .......... *G06F 1/3275* (2013.01); *G06F 1/3287* (2013.01); *G06F 1/3293* (2013.01);
(Continued)

(58) Field of Classification Search
CPC .................................................. G06F 1/3275
See application file for complete search history.

(56) References Cited

U.S. PATENT DOCUMENTS

| 4,609,986 A | 9/1986 | Hartmann et al. |
| 4,642,487 A | 2/1987 | Carter |

(Continued)

FOREIGN PATENT DOCUMENTS

| CN | 001758183 A | 4/2006 |
| CN | 101971500 A | 2/2011 |

(Continued)

OTHER PUBLICATIONS

Choi.D et al., "New Non-Volatile Memory Structures for FPGA Architectures", IEEE Transactions on Very Large Scale Integration (VLSI) Systems, Jul. 1, 2008, vol. 16, No. 7, pp. 874-881, IEEE.

(Continued)

*Primary Examiner* — Mohammed H Rehman
(74) *Attorney, Agent, or Firm* — Fish & Richardson P.C.

(57) ABSTRACT

A method for controlling power supply in a semiconductor device including a CPU and a PLD which can hold data even in an off state is provided. The semiconductor device includes a processor, a programmable logic device, and a state control circuit. The programmable logic device includes a first nonvolatile memory circuit and has a function of holding data obtained by arithmetic processing of the programmable logic device when it is turned off. The state control circuit obtains data on the amount of a task performed by the programmable logic device in accordance with an operation of the processor. The programmable logic device detects the state of progress of the task and outputs a signal to the state control circuit. The state control circuit monitors the amount of the task and the state of progress of the task and turns off the programmable logic device when the task is completed.

16 Claims, 13 Drawing Sheets

(51) Int. Cl.
*G06F 1/3287* (2019.01)
*G06F 1/3293* (2019.01)
*G06F 1/3296* (2019.01)
*G06F 13/42* (2006.01)
*G11C 11/40* (2006.01)
*H03K 19/0175* (2006.01)

(52) U.S. Cl.
CPC ........ *G06F 1/3296* (2013.01); *G06F 13/4234* (2013.01); *G11C 11/40* (2013.01); *H03K 19/017581* (2013.01)

(56) References Cited

U.S. PATENT DOCUMENTS

| | | |
|---|---|---|
| 4,799,193 A | 1/1989 | Horiguchi et al. |
| 4,870,302 A | 9/1989 | Freeman |
| 4,885,719 A | 12/1989 | Brahmbhatt |
| 4,896,296 A | 1/1990 | Turner et al. |
| 5,343,406 A | 8/1994 | Freeman et al. |
| 5,432,719 A | 7/1995 | Freeman et al. |
| 5,488,316 A | 1/1996 | Freeman et al. |
| 5,594,698 A | 1/1997 | Freeman |
| 5,789,942 A | 8/1998 | Mizuno |
| 6,057,707 A | 5/2000 | Schleicher et al. |
| 6,097,212 A | 8/2000 | Agrawal et al. |
| 6,127,702 A | 10/2000 | Yamazaki et al. |
| 6,130,553 A | 10/2000 | Nakaya |
| 6,172,521 B1 | 1/2001 | Motomura |
| 6,351,078 B1 | 2/2002 | Wang et al. |
| 6,359,320 B1 | 3/2002 | Yamazaki et al. |
| 6,363,004 B1 | 3/2002 | Kang et al. |
| 6,384,628 B1 | 5/2002 | Lacey et al. |
| 6,535,422 B2 | 3/2003 | Goto et al. |
| 6,756,632 B1 | 6/2004 | Chen et al. |
| 6,809,425 B1 | 10/2004 | Chen et al. |
| 6,834,009 B1 | 12/2004 | Yue et al. |
| 6,924,663 B2 | 8/2005 | Masui et al. |
| 6,940,307 B1 | 9/2005 | Liu et al. |
| 7,098,689 B1 | 8/2006 | Tuan et al. |
| 7,109,748 B1 | 9/2006 | Liu et al. |
| 7,221,580 B1 | 5/2007 | Penchuk |
| 7,551,493 B1 | 6/2009 | Kato et al. |
| 7,579,864 B2 | 8/2009 | Ichinomiya |
| 7,620,926 B1 | 11/2009 | Tuan |
| 7,674,650 B2 | 3/2010 | Akimoto et al. |
| 7,750,671 B2 | 7/2010 | Kang |
| 7,759,969 B2 | 7/2010 | Madurawe |
| 7,791,074 B2 | 9/2010 | Iwasaki |
| 7,797,664 B2 | 9/2010 | Matsumoto et al. |
| 7,816,947 B1 | 10/2010 | Wang |
| 7,863,611 B2 | 1/2011 | Abe et al. |
| 7,863,930 B2 | 1/2011 | Nishioka |
| 7,973,556 B1 | 7/2011 | Noguera Serra et al. |
| 7,986,160 B2 | 7/2011 | Hoang et al. |
| 8,072,237 B1 | 12/2011 | Rahim et al. |
| 8,547,753 B2 | 10/2013 | Takemura et al. |
| 8,599,111 B2 | 12/2013 | Abe et al. |
| 8,654,114 B2 | 2/2014 | Shimizu et al. |
| 8,675,382 B2 | 3/2014 | Kurokawa |
| 8,970,251 B2 | 3/2015 | Kurokawa |
| 9,007,093 B2 | 4/2015 | Kurokawa et al. |
| 9,285,848 B2* | 3/2016 | Miwa ................... G06F 1/26 |
| 9,286,985 B2* | 3/2016 | Kimura ................ G06F 1/3225 |
| 9,372,694 B2* | 6/2016 | Yoneda ............. G06F 9/30145 |
| 2002/0015326 A1 | 2/2002 | Rolandi et al. |
| 2002/0145907 A1 | 10/2002 | Byeon et al. |
| 2003/0122578 A1 | 7/2003 | Masui et al. |
| 2005/0114722 A1 | 5/2005 | Tanaka et al. |
| 2006/0075267 A1 | 4/2006 | Tokue |
| 2007/0210826 A1 | 9/2007 | Madurawe |
| 2008/0067508 A1 | 3/2008 | Endo et al. |
| 2008/0169836 A1 | 7/2008 | Rahim et al. |
| 2008/0291350 A1 | 11/2008 | Hayashi et al. |
| 2009/0115452 A1 | 5/2009 | Ichinomiya |
| 2009/0167352 A1 | 7/2009 | Norman |
| 2010/0038625 A1 | 2/2010 | Bertin |
| 2010/0084648 A1 | 4/2010 | Watanabe |
| 2010/0148171 A1 | 6/2010 | Hayashi et al. |
| 2010/0148820 A1 | 6/2010 | Nishioka |
| 2010/0276689 A1 | 11/2010 | Iwasaki |
| 2011/0065269 A1 | 3/2011 | Hayashi et al. |
| 2011/0089417 A1 | 4/2011 | Yamazaki et al. |
| 2011/0089975 A1 | 4/2011 | Yamazaki et al. |
| 2011/0101351 A1 | 5/2011 | Yamazaki |
| 2012/0170355 A1 | 7/2012 | Ohmaru et al. |
| 2012/0250397 A1 | 10/2012 | Ohmaru |
| 2012/0293200 A1 | 11/2012 | Takemura |
| 2012/0293201 A1 | 11/2012 | Fujita et al. |
| 2012/0293202 A1 | 11/2012 | Nishijima et al. |
| 2012/0293206 A1 | 11/2012 | Yoneda et al. |
| 2012/0293209 A1 | 11/2012 | Takewaki |
| 2012/0293242 A1 | 11/2012 | Kato |
| 2013/0080806 A1 | 3/2013 | Koyama |
| 2013/0207170 A1 | 8/2013 | Kurokawa |
| 2013/0238824 A1* | 9/2013 | Sasaki ................... G06F 13/385 710/63 |
| 2013/0285697 A1 | 10/2013 | Kurokawa |
| 2013/0314123 A1 | 11/2013 | Takemura |
| 2013/0314124 A1 | 11/2013 | Ikeda et al. |
| 2014/0035618 A1 | 2/2014 | Tatsumura et al. |
| 2014/0126271 A1 | 5/2014 | Aoki et al. |
| 2014/0159771 A1 | 6/2014 | Ikeda et al. |
| 2014/0189223 A1* | 7/2014 | Ichinohe ................ G06K 19/07 711/103 |
| 2014/0226781 A1 | 8/2014 | Kurokawa |
| 2014/0368235 A1 | 12/2014 | Aoki et al. |
| 2015/0207509 A1 | 7/2015 | Kurokawa |
| 2015/0227378 A1 | 8/2015 | Kurokawa |
| 2015/0227379 A1 | 8/2015 | Kurokawa |
| 2015/0324411 A1* | 11/2015 | Fukuoka ................ G06K 1/12 707/736 |
| 2017/0187379 A1 | 6/2017 | Kurokawa |

FOREIGN PATENT DOCUMENTS

| | | |
|---|---|---|
| CN | 102737707 A | 10/2012 |
| EP | 1645940 A | 4/2006 |
| JP | 2006-107127 A | 4/2006 |
| JP | 2007-096055 A | 4/2007 |
| JP | 2012-257200 A | 12/2012 |
| JP | 2013-073318 A | 4/2013 |
| KR | 2006-0051490 A | 5/2006 |
| KR | 2012-0112179 A | 10/2012 |
| WO | WO-2009/034953 | 3/2009 |
| WO | WO-2009/063584 | 5/2009 |

OTHER PUBLICATIONS

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

Naito.T et al., "World's first monolithic 3D-FPGA with TFT SRAM over 90nm 9 layer Cu CMOS", 2010 Symposium on VSLI Technology : Digest of Technical Papers, Jun. 15, 2010, pp. 219-220.

Song.I et al., "Short Channel Characteristics of Gallium-Indium-Zinc-Oxide Thin Film Transistors for Three-Dimensional Stacking Memory", IEEE Electron Device Letters, Jun. 1, 2008, vol. 29, No. 6, pp. 549-552.

Nomura.K et al., "Subgap states in transparent amorphous oxide semiconductor, In—Ga—Zn—O, observed by bulk sensitive x-ray

(56) References Cited

OTHER PUBLICATIONS photoelectron spectroscopy", Appl. Phys. Lett. (Applied Physics Letters), 2008, vol. 92, pp. 202117-1-202117-3.
Yabuta.H et al., "High-Mobility Thin-Film Transistor With Amorphous InGaZnO4 Channel Fabricated by Room Temperature RF-Magnetron Sputtering", Appl. Phys. Lett. (Applied Physics Letters), 2006, vol. 89, pp. 112123-1-112123-3.
Jeon.S et al., "180nm Gate Length Amorphous InGaZnO Thin Film Transistor for High Density Image Sensor Applications", IEDM 10: Technical Digest of International Electron Devices Meeting, Dec. 6, 2010, pp. 504-507.
Chun.K et al., "A 3T Gain Cell Embedded DRAM Utilizing Preferential Boosting for High Density and Low Power On-Die Caches", IEEE Journal of Solid-State Circuits, Jun. 1, 2011, vol. 46, No. 6, pp. 1495-1505.
Kozuma.M et al., "Crystalline In—Ga—Zn—O FET-based Configuration Memory for Multi-Context Field-Programmable Gate Array Realizing Fine-Grained Power Gating", SSDM 2013 (Extended Abstracts of the 2013 International Conference on Solid State Devices and Materials), Sep. 24, 2013, pp. 1096-1097.
International Search Report (Application No. PCT/IB2017/054876) dated Nov. 28, 2017.
Written Opinion (Application No. PCT/IB2017/054876) dated Nov. 28, 2017.

\* cited by examiner

METHOD FOR CONTROLLING POWER SUPPLY IN SEMICONDUCTOR DEVICE

TECHNICAL FIELD

One embodiment of the present invention relates to a method for controlling power supply in a semiconductor device.

BACKGROUND ART

As a device whose circuit configuration can be arbitrarily changed by a user, a programmable logic device (PLD) is known.

A logic element included in the PLD includes a lookup table (LUT) and a register. When data stored in a configuration memory included in the LUT is changed, a function of the logic element can be changed.

Patent Document 1 discloses a circuit configuration in which a transistor containing a metal oxide serving as a semiconductor in its channel formation region (OS transistor) is connected to a gate of a transistor containing silicon in its channel formation region (Si transistor). With the circuit configuration, configuration data and data in the register can be held even when the PLD is in an off state.

Patent Document 2 discloses a configuration in which an OS transistor is connected to a gate of a Si transistor and data in the register is held even when a central processing unit (CPU) is in an off state. The CPU performs a variety of kinds of arithmetic processing in accordance with a program to be executed. A PLD or a GPU can be used as a coprocessor in order to improve the arithmetic processing performance of the CPU.

REFERENCE

Patent Document

[Patent Document 1] United States Patent Application Publication No. 2014/0126271
[Patent Document 2] United States Patent Application Publication No. 2012/0170355

DISCLOSURE OF INVENTION

By the combination of the above CPU and PLD which can hold data even when turned off, improved arithmetic processing performance and lower power consumption are expected to be achieved. In order to achieve them, it is desirable to turn off the CPU and/or the PLD during an appropriate period so that power consumption can be reduced without reducing the arithmetic processing performance.

An object of one embodiment of the present invention is to provide a method for controlling power supply in a semiconductor device including a CPU and a PLD which can hold data even in an off state.

One embodiment of the present invention is a method for controlling power supply in a semiconductor device including a processor, a programmable logic device, and a state control circuit. The programmable logic device holds data, which is obtained by performing arithmetic processing, in a first nonvolatile memory circuit when it is turned off. The state control circuit holds data corresponding to a state of a task performed by the programmable logic device in accordance with an operation of the processor. The programmable logic device detects a state of progress of the task and outputs a signal to the state control circuit. The state control circuit turns off the programmable logic device when the task is completed.

Another embodiment of the present invention is a method for controlling power supply in a semiconductor device including a processor, a programmable logic device, a state control circuit, and a power management unit. The programmable logic device holds data, which is obtained by performing arithmetic processing, in a first nonvolatile memory circuit when it is turned off. The processor holds data, which is obtained by performing arithmetic processing, in a second nonvolatile memory circuit of the processor when it is turned off. The state control circuit holds data corresponding to a state of a task performed by the programmable logic device in accordance with an operation of the processor. The programmable logic device detects a state of progress of the task and outputs a signal to the state control circuit. The state control circuit turns off the programmable logic device when the task is completed. The power management unit turns off the processor when the operation is completed.

In each of the above embodiments, it is preferable that the programmable logic device include a first programmable area and a second programmable area. The first programmable area has a circuit configuration with which the state of progress of the task is detected. The second programmable area has a circuit configuration with which arithmetic processing based on the task is performed.

Note that other embodiments of the present invention are shown below in the description of Embodiments and the drawings.

According to one embodiment of the present invention, it is possible to provide a method for controlling power supply in a semiconductor device including a CPU and a PLD which can hold data even in an off state. This controlling method can achieve an improvement in arithmetic processing performance and low power consumption.

BEST MODE FOR CARRYING OUT THE INVENTION

Figure 1:
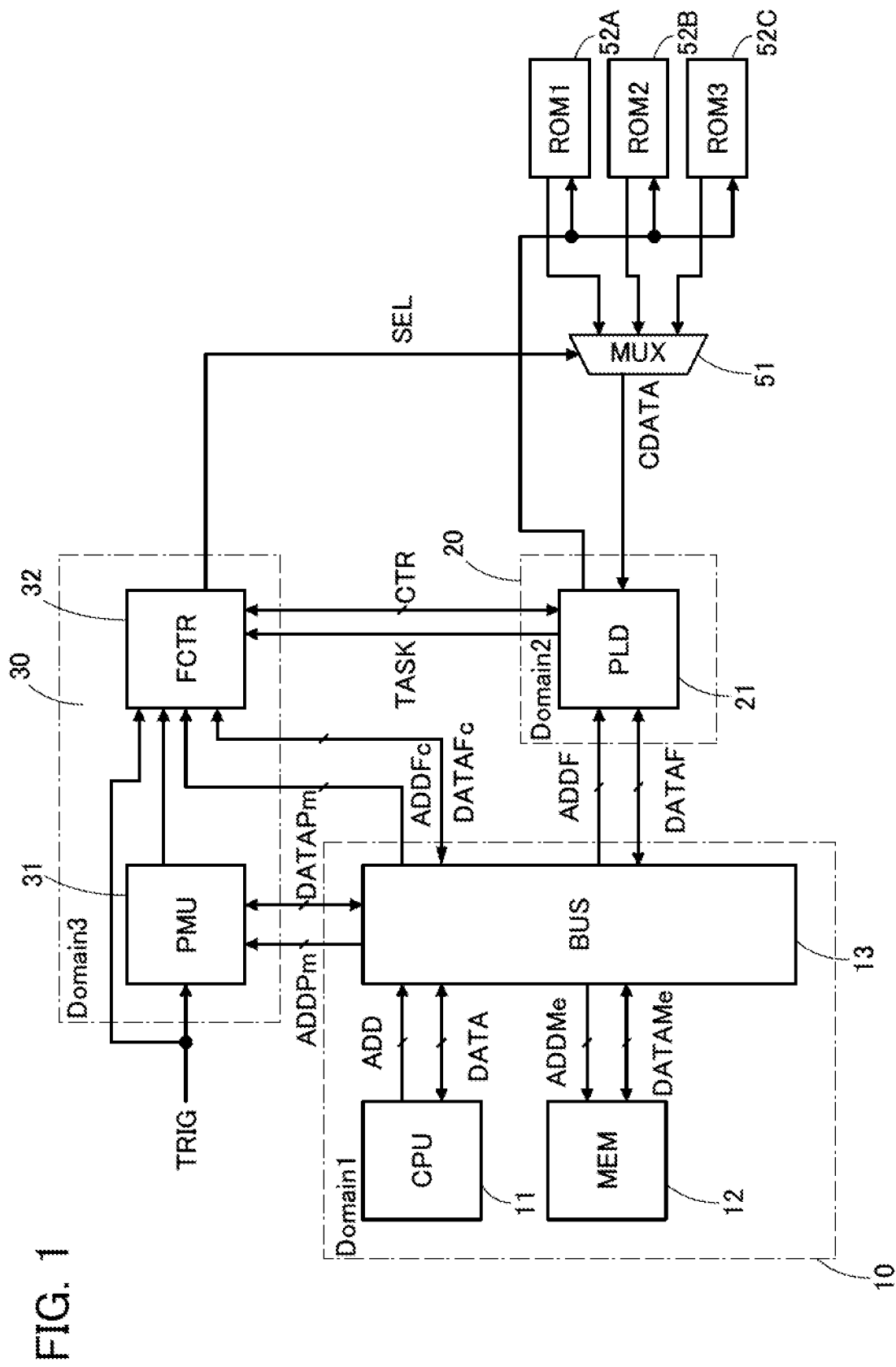
FIG. 1 is a block diagram illustrating one embodiment of the present invention.

Hereinafter, embodiments will be described with reference to drawings. Note that the embodiments can be implemented with various modes, and it will be readily appreciated by those skilled in the art that modes and details can be changed in various ways without departing from the spirit and scope of the present invention. Therefore, one embodiment of the present invention should not be construed as being limited to the description of the following embodiments.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in a semiconductor layer of a transistor is called an oxide semiconductor in some cases. That is to say, a metal oxide that has at least one of an amplifying function, a rectifying function, and a switching function can be called a metal oxide semiconductor, or OS for short. In addition, an OS FET is a transistor including a metal oxide or an oxide semiconductor.

In this specification and the like, a metal oxide including nitrogen is also called a metal oxide in some cases. Moreover, a metal oxide including nitrogen may be called a metal oxynitride.

In this specification and the like, "c-axis aligned crystal (CAAC)" or "cloud-aligned composite (CAC)" might be stated. CAAC refers to an example of a crystal structure, and CAC refers to an example of a function or a material composition.

In this specification and the like, a CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in a semiconductor layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or CAC-metal oxide, separation of the functions can maximize each function.

In this specification and the like, the CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel region of a transistor, high current drive capability in the on state of the transistor, that is, high on-state current and high field-effect mobility, can be obtained.

In other words, CAC-OS or CAC-metal oxide can be called a matrix composite or a metal matrix composite.

(Embodiment 1)

In this embodiment, a method for controlling power supply in a semiconductor device is described. In this specification, a semiconductor device generally means a device which can function by utilizing semiconductor characteristics. Specifically, a semiconductor device means a device or a system including a circuit such as a CPU or a PLD.

<Configuration of Semiconductor Device>

FIG. 1 is a block diagram of a semiconductor device. The semiconductor device in FIG. 1 includes a CPU 11, a memory 12 ("MEM" in the diagram), a bus 13 ("BUS" in the diagram), a PLD 21, a power management unit 31 ("PMU" in the diagram), a state control circuit 32 ("FCTR" in the diagram), a multiplexer 51 ("MUX" in the diagram), and configuration ROMs 52A, 52B, and 52C ("ROM1", "ROM2", and "ROM3" in the diagram).

The bus 13 has a function of connecting the CPU 11 to a variety of modules. The PLD 21 is a circuit capable of switching a task in accordance with configuration data and executing the task. The PLD 21 functions as a field programmable gate array (FPGA). The state control circuit 32 has a function of controlling the state of the PLD 21. The configuration ROMs 52A to 52C are each a circuit for storing configuration data corresponding to a task of the PLD 21. The multiplexer 51 is a circuit for selecting any one of the configuration ROMs 52A to 52C.

As illustrated in FIG. 1, a proposed system includes a power domain 10 ("Domain 1" in the diagram), a power domain 20 ("Domain 2" in the diagram), and a power domain 30 ("Domain 3" in the diagram). The power domain 10 includes the CPU 11, the memory 12, and the bus 13. The power domain 20 includes the PLD 21. The power domain 30 includes the power management unit 31 and the state control circuit 32. Note that the power management unit 31 and the state control circuit 32 may be provided in different domains.

The CPU 11 performs a variety of kinds of arithmetic processing in accordance with a program. The CPU 11 is also referred to as a processor. The CPU 11 recognizes the memory 12, the power management unit 31, the state control circuit 32, and the PLD 21 to be memories assigned to particular logic addresses. That is, an address signal transmitted from the CPU 11 is transmitted through an address signal line ADD and the bus 13 to a desired module, so that the CPU 11 can access the desired module. In the case where an access is made, desired data is transmitted through a data signal line DATA. Here, an address signal line and a data signal line of the memory 12 are referred to as ADDMe and DATAMe, respectively. An address signal line and a data signal line of the power management unit 31 are referred to as ADDPm and DATAPm, respectively. An address signal line and a data signal line of the state control circuit 32 are referred to as ADDFc and DATAFc, respectively. An address signal line and a data signal line of the PLD 21 are referred to as ADDF and DATAF, respectively.

Note that the CPU 11 can perform arithmetic processing or data processing the PLD 21 does not perform. Furthermore, the CPU 11 can determine which can perform specific arithmetic processing with higher efficiency, the PLD 21 or the CPU 11 itself.

The memory 12 is a working memory of the CPU 11 and has a function of storing processing data of the CPU 11.

The power management unit 31 functions as a circuit for controlling power supply of the power domain 10 and controls the on/off of the power domain 10 in accordance with an operation from the CPU 11. In addition, the power management unit 31 functions as a timer. Accordingly, when the power domain 10 is in an off state, the power domain 10 can return from an off state to an on state periodically. Moreover, the power management unit 31 can receive a trigger signal TRIG from the outside of the system. With the trigger signal TRIG, the power domain 10 can return from an off state to an on state.

The PLD 21 is connected to the address signal line ADDF and the data signal line DATAF, and the CPU 11 can access the PLD 21 through the address signal line ADDF and the data signal line DATAF. The PLD 21 is connected to the state control circuit 32 through a signal line TASK and a signal bus CTR. Furthermore, the PLD 21 is connected to the configuration ROMs 52A, 52B, and 52C (ROM1, ROM2, and ROM3) through the multiplexer 51, and can receive configuration data from any of the configuration ROMs 52A to 52C selected by the multiplexer 51, so that the circuit configuration can be changed.

The state control circuit 32 has a function of controlling the on/off of the PLD 21 (the power domain 20) in accordance with an output signal from the PLD 21 through the signal line TASK. Specifically, in the case where a specific task is completed, the PLD 21 transmits the end of the specific task through the signal line TASK to the state control circuit 32. The state control circuit 32 includes a register which holds data corresponding to a state of the specific task; data on whether the specific task is completed or not is stored in the register. In the case where the state control circuit 32 receives data indicating the end of the specific task from the PLD 21, the state control circuit 32 can turn off the PLD 21 (the power domain 20). A register included in each logic element in the PLD 21 includes a nonvolatile region, and thus data in the register in the PLD 21 can be saved in the nonvolatile region just before the PLD 21 (the power domain 20) is turned off. Thus, even when the PLD 21 (the power domain 20) is turned off, a result of arithmetic processing by the PLD 21 (data in the register) can be held for a long period.

Furthermore, the state control circuit 32 has a function of changing the circuit configuration of the PLD 21. The PLD 21 can change the circuit configuration by obtaining configuration data from a desired one of the configuration ROMs 52A to 52C using an output signal transmitted from the state control circuit 32 through the signal bus CTR. Here, the state control circuit 32 can select a desired configuration ROM by transmitting data on which configuration ROM is selected to the multiplexer 51 through a wiring SEL. Note that the above control can be also performed by the CPU 11.

The CPU 11 has a function of periodically monitoring data on whether the specific task is completed or not, which is stored in the register that holds data corresponding to a state of the specific task of the state control circuit 32. In the case where the specific task is completed, the CPU 11 requires the state control circuit 32 to boot up the PLD 21 (to turn on the power domain 20). The state control circuit 32 turns on the PLD 21 (the power domain 20) in accordance with the requirement. At this time, in the PLD 21, data can be restored from the nonvolatile region in the register included in each logic element. That is, data before the PLD 21 (the power domain 20) is turned off can be restored. The CPU 11 can access the PLD 21 through the bus 13 and thus can retrieve data stored in the register in the PLD 21.

In the above manner, the CPU 11 can obtain a result of arithmetic processing by the PLD 21.

Note that in the semiconductor device in FIG. 1, a configuration in which the plurality of PLDs 21 is provided in the power domain 20 may be employed. The plurality of PLDs may be provided in different power domains. With the configuration in which the plurality of PLDs 21 is provided, the CPU 11 can determine which of the PLDs 21 is suitable for arithmetic processing. Alternatively, in the semiconductor device in FIG. 1, a configuration including a different processing device that includes a GPU or the like may be employed. With the configuration, the CPU 11 can determine which of the PLD 21 and the GPU is suitable for arithmetic processing.

Figure 2:
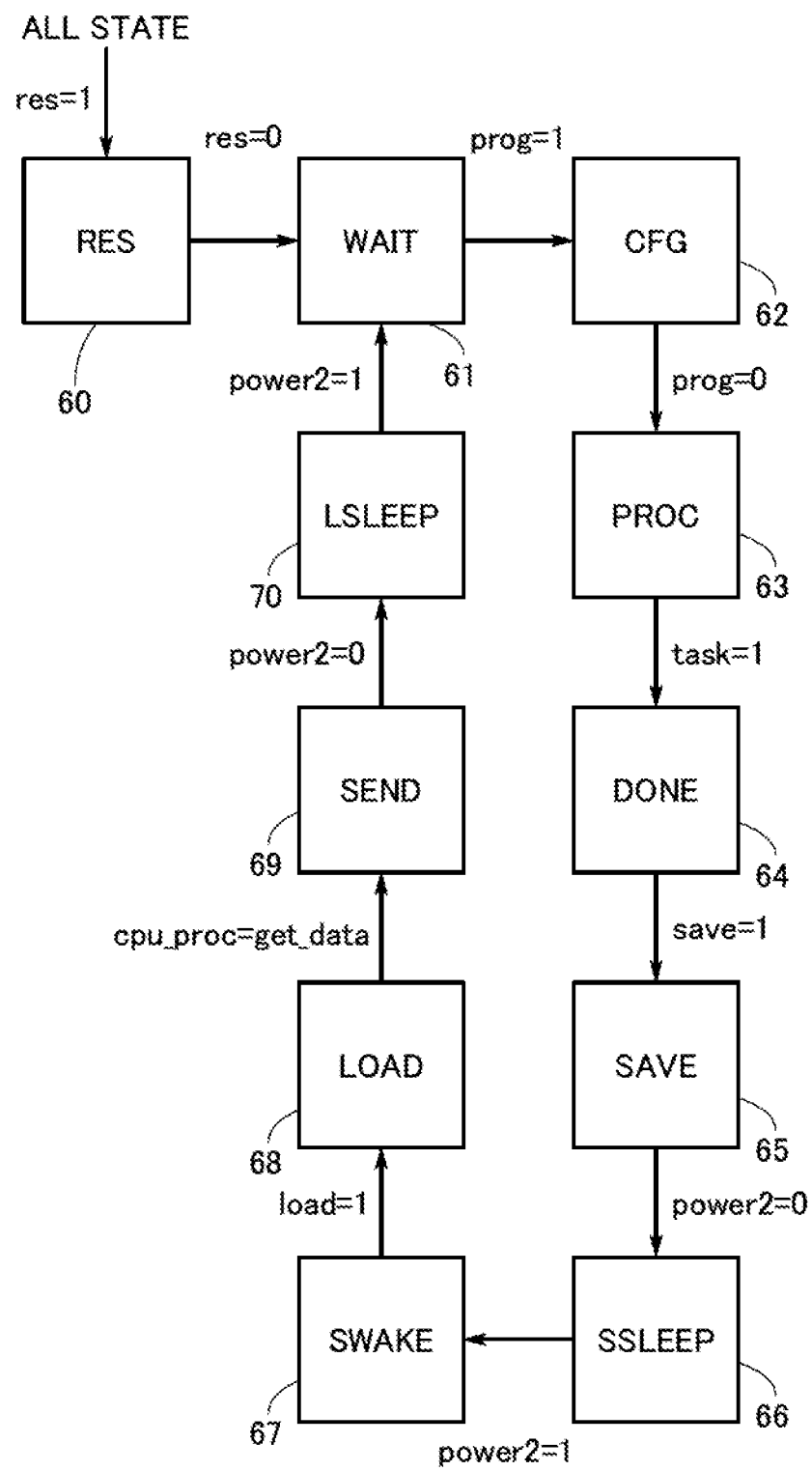
FIG. 2 is a state transition diagram illustrating one embodiment of the present invention.
Figure 3:
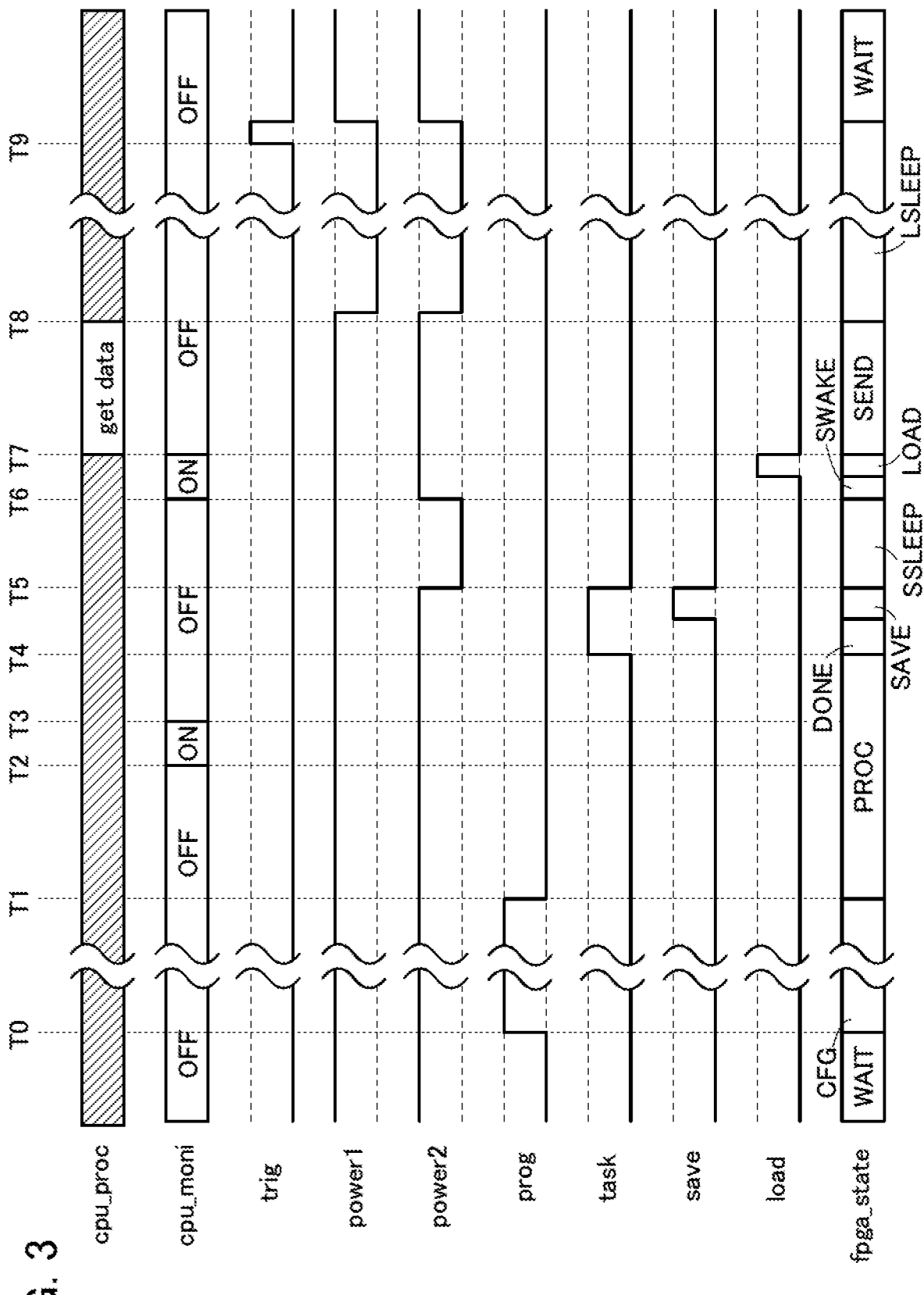
FIG. 3 is a flow chart showing one embodiment of the present invention.

FIG. 2 is a state transition diagram of the PLD 21. FIG. 3 is a timing chart showing operation of the system illustrated in FIG. 1. In FIG. 2 and FIG. 3, a state "cpu_proc" shows a processing state of the CPU 11.

States and signals in the timing chart in FIG. 3 are described.

A state "cpu_moni" shows a state in which the CPU 11 monitors the state control circuit 32 to check whether a task of the PLD 21 is completed or not. In the case where the state "cpu_moni" shows "OFF", the CPU 11 does not monitor whether the task is completed or not. In the case where the state "cpu_moni" shows "ON", the CPU 11 monitors whether the task is completed or not.

A signal trig is a signal of a signal line TRIG connected to the power management unit 31 and the state control circuit 32. The signal trig is a signal for turning on the power domain 10 and the power domain 20 in an off state. The signal trig is a signal input from the outside. Note that as described above, the power management unit 31 may function as a timer. In that case, the timing at which the power domain 10 and the power domain 20 are turned on is determined using the timer.

A signal power 1 is a signal showing whether power is supplied to the power domain 10 or not. In the case where the signal power 1 is at a high level, the power domain 10 is on. In the case where the signal power 1 is at a low level, the power domain 10 is off.

A signal power 2 is a signal showing whether power is supplied to the power domain 20 or not. In the case where the signal power 2 is at a high level, the power domain 20 is on. In the case where the signal power 2 is at a low level, the power domain 20 is off.

A signal prog is a signal for controlling configuration of the circuit configuration of the PLD 21. When the signal prog becomes a high level, the PLD 21 starts the configuration of the circuit. As configuration data at this time, data of a desired configuration ROM is used.

A signal task, which indicates data on whether a task of the PLD 21 is completed or not, is output from the PLD 21 to the state control circuit 32 through the signal line TASK. The signal task at a high level means the end of the task.

A signal save is a signal for saving data in the registers in the logic elements of the PLD 21 in the nonvolatile region. The signal save at a high level means that data in the registers is saved in the nonvolatile region.

A signal load is a signal for restoring data in the registers in the logic elements of the PLD 21 from the nonvolatile region. The signal load at a high level means that data in the registers is restored from the nonvolatile region.

Note that the signal power 2, the signal prog, the signal save, and the signal load are signals from the state control circuit 32 used for controlling the PLD 21 and are transmitted through the signal bus CTR.

Next, each state in the state transition diagram of the PLD 21 in FIG. 2 is described.

In all states ("ALL STATE" in the diagram), when a reset signal res of the PLD 21 becomes a high level (res=1), the state of the PLD 21 becomes a reset state 60 ("RES" in the diagram).

When the state of the PLD 21 is the state 60 and the reset signal res of the PLD 21 becomes a low level (res=0), state transition to a state 61 ("WAIT" in the diagram) occurs in the PLD 21. The state 61 is a waiting state of an operation from the CPU 11.

When the state of the PLD 21 is the state 61 and the signal prog becomes a high level (prog=1), state transition to a state 62 ("CFG" in the diagram) occurs in the PLD 21. The state 62 is a state in which configuration of the PLD 21 is performed.

When the configuration of the PLD 21 is completed and the signal prog becomes a low level (prog=0), state transition to a state 63 ("PROC" in the diagram) occurs in the PLD 21. The state 63 is a state in which the PLD 21 performs arithmetic processing in accordance with the operation from the CPU 11.

When the PLD 21 completes the arithmetic processing in the state 63, the PLD 21 transmits data indicating the end of a task to the state control circuit 32 through the signal line TASK. Specifically, the signal task becomes a high level (task=1), and the data indicating the end of the task is transmitted. When the signal task becomes a high level, state transition to a state 64 ("DONE" in the diagram) occurs in the PLD 21. The state 64 is a state in which the task of the PLD 21 is completed.

When the task of the PLD 21 is completed, the state control circuit 32 inputs the signal save to the PLD 21 through the signal bus CTR. Specifically, the signal save becomes a high level (save=1). When the signal save becomes a high level, state transition to a state 65 ("SAVE" in the diagram) occurs in the PLD 21. The state 65 is a state in which data in the registers in the logic elements of the PLD 21 is saved in the nonvolatile region.

When the saving of the data in the registers is completed in the state 65, the state control circuit 32 changes the level of the signal power 2 through the signal bus CTR. Specifically, the signal power 2 is changed from a high level to a low level. When the signal power 2 becomes a low level (power 2=0), state transition to a state 66 ("SSLEEP" in the diagram) occurs in the PLD 21. The state 66 is a state in which the PLD 21 is off, that is, a state in which power supply is stopped.

When the PLD 21 is in the state 66 and the signal power 2 becomes a high level (power 2=1), state transition to a state 67 ("SWAKE" in the diagram) occurs in the PLD 21. The state 67 is a state in which the PLD 21 is changed from an off state to an on state, that is, a state in which power is supplied.

When the PLD 21 is in the state 67 and the single load becomes a high level (load=1), state transition to a state 68 ("LOAD" in the diagram) occurs in the PLD 21. The state 68 is a state in which the data in the registers saved in the nonvolatile region in the state 65 is restored.

When the PLD 21 is in the state 68 and the processing state of the CPU 11, i.e., the state "cpu_proc", becomes a state in which a result of arithmetic processing by the PLD 21 is read ("get_data" in the diagram, cpu_proc=get_data), state transition to a state 69 ("SEND" in the diagram) occurs in the PLD 21. The state 69 is a state in which the result of the arithmetic processing by the PLD 21 is transmitted to the CPU 11. Specifically, the CPU 11 reads data from the register that stores the result of the arithmetic processing by the PLD 21.

When the CPU 11 receives the data, the CPU 11 performs operations for turning off the power domain 10 and the power domain 20 on the power management unit 31 and the state control circuit 32. The power management unit 31 and the state control circuit 32 make the signal power 1 and the signal power a low level in accordance with the operations. When the PLD 21 is in the state 69 and the signal power 2 becomes a low level (power 2=0), state transition to a state 70 ("LSLEEP" in the diagram) occurs in the PLD 21.

When the signal trig from the outside becomes a high level while the PLD 21 is in the state 70, the power management unit 31 and the state control circuit 32 turn on the power domain 10 and the power domain 20. Specifically, the power management unit 31 and the state control circuit 32 set the signal power 1 and the signal power 2 at a high level. When the PLD 21 is in the state 70 and the signal power 2 becomes a high level (power 2=1), state transition to the state 61 occurs in the PLD 21.

The timing chart in FIG. 3 is described. Note that a state "fpga_state" in the timing chart in FIG. 3 indicates the state of the PLD 21. The state "fpga_state" in FIG. 3 corresponds to any of the states 61 to 70 described with reference to FIG. 2.

Before Time T0, the PLD 21 is in the state 61. At Time T0, the signal prog becomes a high level. Accordingly, the state "fpga_state" is changed to the state 62, and thus configuration is performed in the PLD 21.

At Time T1, the configuration of the PLD 21 is completed, and the signal prog becomes a low level, whereby the state "fpga_state" is changed to the state 63 and arithmetic processing of a specific task is performed in the PLD 21.

Before Time T2, the state "cpu_moni" is off, so that whether the task of the PLD 21 is completed or not is not monitored. At Time T2, the state "cpu_moni" becomes on, and thus the CPU 11 monitors the state control circuit 32 to check whether the task of the PLD 21 is completed or not. Nothing occurs because the task of the PLD 21 is not completed before Time T2.

At Time T3, the state "cpu_moni" becomes off, and thus a period during which the CPU 11 monitors whether the task of the PLD 21 is completed or not ends.

At Time T4, the task of the PLD 21 is completed, and the signal task becomes a high level. The state control circuit 32 receives data indicating the end of the task of the PLD 21 and turns off the PLD 21 (the power domain 20). Specifically, first, the signal save is set at a high level, data in the register in each logic element of the PLD 21 is saved in the nonvolatile region, and after that, the signal power 2 is set at a low level at Time T5, whereby the PLD 21 (the power domain 20) is turned off. During the period before the PLD 21 is turned off, the state "fpga_state" is changed to the state 64, the state 65, and the state 66 in this order.

At Time T6, the state "cpu_moni" becomes on, and thus the CPU 11 monitors the state control circuit 32 to check whether the task of the PLD 21 is completed or not. Since the task of the PLD 21 has been completed, data indicating the end of the task of the PLD 21 is transmitted to the CPU 11 at this time. The CPU 11 sends operations for turning on the PLD 21 (the power domain 20) to the state control circuit 32. Specifically, the state control circuit 32 can turn on the PLD 21 (the power domain 20). That is, the signal power 2 becomes a high level. Here, the signal load becomes a high level. When the signal load becomes a high level, data in the register in each logic element of the PLD 21 can be restored from the nonvolatile region. During a period until the data in the register is restored from the nonvolatile region, the state "fpga_state" is changed to the state 67 and the state 68 in this order.

At Time T7, the state "cpu_proc" becomes the signal processing state "get_data". Specifically, the CPU 11 accesses the PLD 21 to obtain data stored in the register in each logic element of the PLD 21. When the data stored in the register is obtained, the state "fpga_state" is changed to the state 69.

At Time T8, the CPU 11 completes obtaining the data from the PLD 21. After that, the power management unit 31 turns off the power domain 10 and the power domain 20. Specifically, the signal power 1 and the signal power 2 become a low level. When the signal power 1 and the signal power 2 become a low level, the state "fpga_state" is changed to the state 70.

At Time T9, the signal trig at a high level is input from the outside. That is, the power domain 10 and the power domain 20 are turned on. Specifically, the signal power 1 and the signal power 2 become a high level. When the signal power 1 and the signal power 2 become a high level, the state "fpga_state" is changed to the state 61.

In the above manner, the PLD 21 can be turned off after the end of a task, and the PLD 21 and the CPU 11 can be turned off after data is obtained. Although the power domain 10 and the power domain 20 are turned off at Time T6, the power domain 10 and the power domain 20 are not turned off when the CPU 11 or the PLD 21 has another task so that the task can continue.

Figure 4:
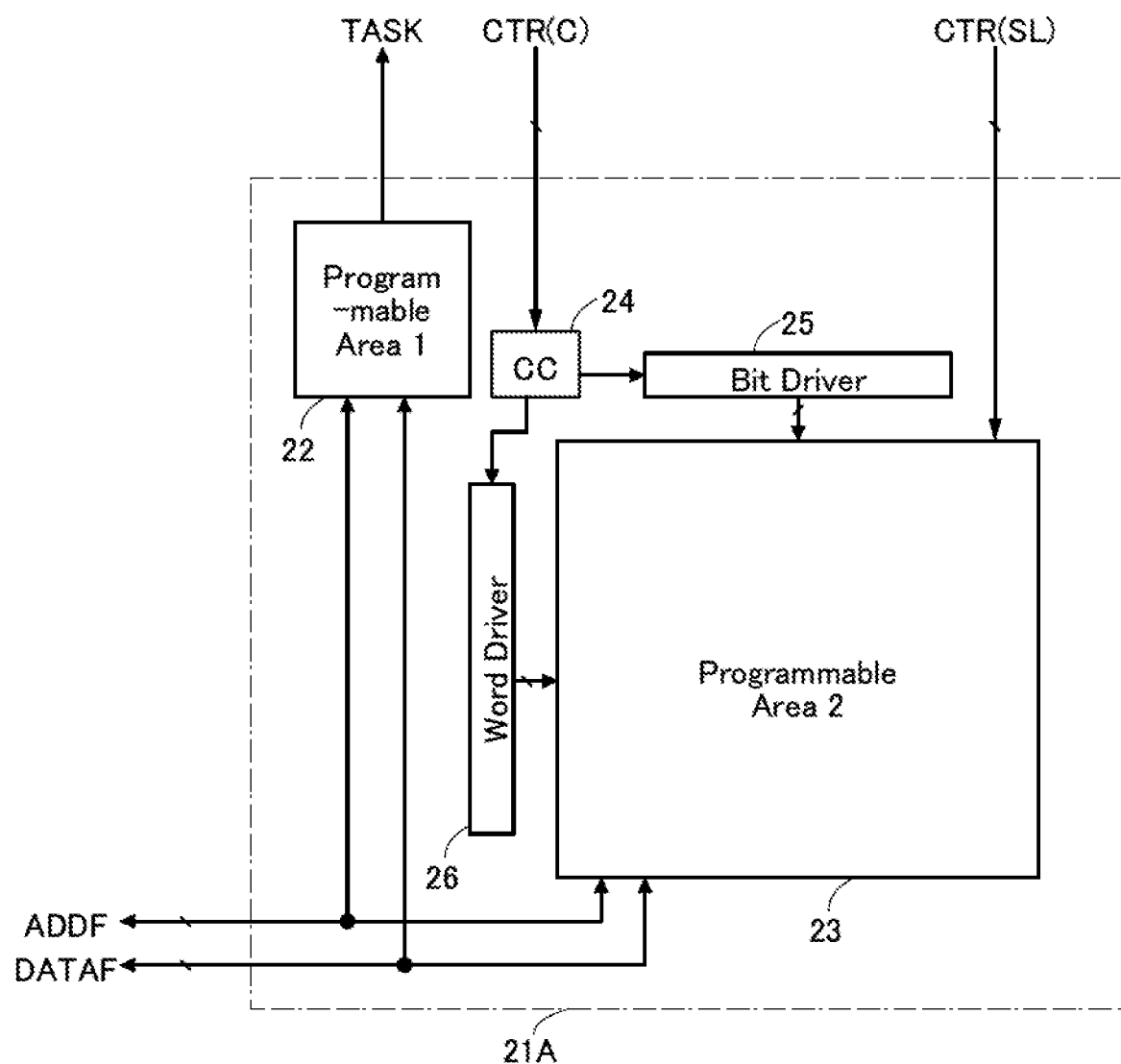
FIG. 4 is a block diagram illustrating a PLD.
Figure 5:
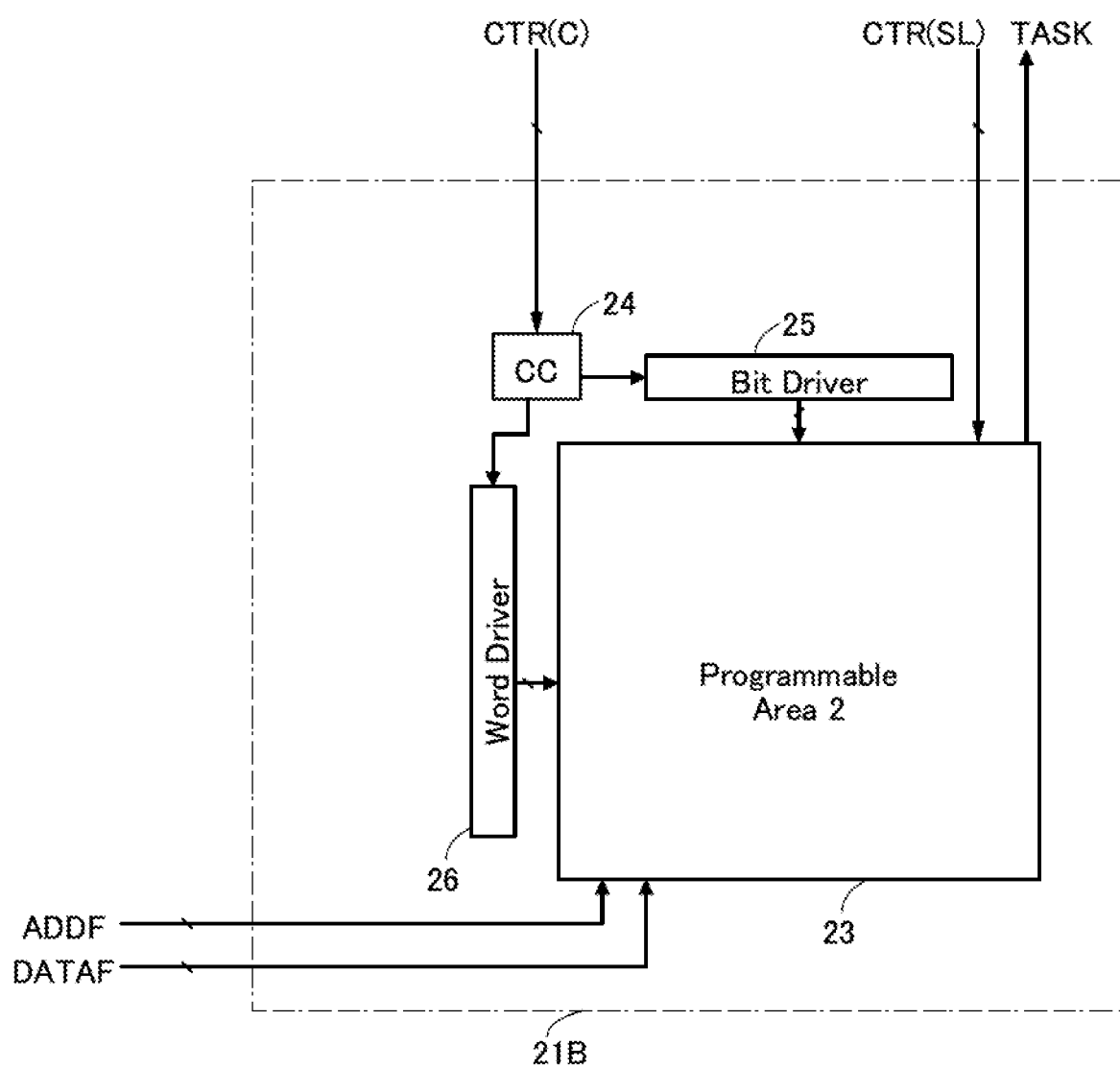
FIG. 5 is a block diagram illustrating a PLD.

It is described how the signal task is generated after the end of a task by the PLD 21 with reference to FIG. 4 and FIG. 5.

FIG. 4 illustrates a configuration example of a PLD 21A which can be used as the PLD 21 in FIG. 1. The PLD 21A includes a programmable area 22 ("Programmable Area 1" in the diagram), a programmable area 23 ("Programmable Area 2" in the diagram), a control circuit 24 ("CC" in the diagram), a bit line driver circuit 25 ("Bit Driver" in the diagram), and a word line driver circuit 26 ("Word Driver" in the diagram).

The programmable areas 22 and 23 each include logic elements, wirings between the logic elements, wiring switches, and user I/O (input/output). In the programmable area 22, the circuit configuration can be changed in accordance with operations from the CPU 11 through the address signal line ADDF and the data signal line DATAF. Specifically, the programmable area 22 can have a configuration of a simple circuit such as a counter. In the programmable area 23, the circuit configuration can be changed in accordance with data in the configuration ROMs 52A to 52C, and complicated arithmetic processing can be performed owing to the circuit configuration.

A signal bus CTR(C) is a bus for transmitting a control signal for changing the circuit configuration of the programmable area 23. The control circuit 24 receives the control signal through the signal bus CTR(C), and the circuit configuration of the programmable area 23 is changed using the word line driver circuit 26 and the bit line driver circuit 25.

A signal bus CTR(SL) is a bus for transmitting a control signal (save or load) for saving data, which is in the registers in the logic elements of the programmable area 23, in a nonvolatile region or restoring data from the nonvolatile region to the register. The data in the registers can be saved or restored in accordance with the control signal through the signal bus CTR(SL).

<Configuration Example 1 for Obtaining Data on End of Task>

Assume that the CPU 11 obtains data on the amount of arithmetic processing by the PLD 21A and the number of clocks required for the arithmetic processing by the PLD 21A. By the CPU 11, a circuit such as a counter is configured in the programmable area 22. The programmable area 22 can have a circuit configuration which can be used for counting the number of clocks required for the arithmetic processing by the PLD 21A so that the signal task can be transmitted when the number of clocks reaches a specific value.

Counting starts in the programmable area 22 at the same time as the arithmetic processing starts. When the arithmetic processing in the programmable area 23 is completed, the value counted in the programmable area 22 reaches a specific value, and thus the signal task which is data indicating the end of the task by the PLD 21A is transmitted to the state control circuit 32 through the signal line TASK.

In the above manner, the data indicating the end of the task by the PLD 21A can be transmitted to the state control circuit 32.

<Configuration Example 2 for Obtaining Data on End of Task>

Another example of a method for obtaining data on the end of the task by the PLD 21A is described. When the PLD 21A performs specific arithmetic processing, the number of clocks required for single arithmetic processing is uniquely determined and thus can be counted in the programmable area 23.

The case where the PLD 21A performs 32 bits×32 bits multiplication processing is described, for example. In the case where the multiplication processing is completed at a maximum of 32 clocks, the programmable area 23 can have a circuit configuration capable of counting 32 clocks.

The CPU 11 can transmit data on how many times the PLD 21A repeats single arithmetic processing to the PLD 21A. In other words, the CPU 11 can transmit data on the amount of data to be subjected to arithmetic processing to the PLD 21A in advance. In this case, the programmable area 22 receives the data on the amount of data to be subjected to arithmetic processing and can have a circuit configuration for counting the number of clocks until it reaches the amount of data to be subjected to arithmetic processing by the PLD 21A. When the count value counted in the programmable area 22 reaches a specific value, the signal task which is data indicating the end of the task by the PLD 21A is transmitted to the state control circuit 32 through the signal line TASK.

In the above manner, the data indicating the end of the task by the PLD 21A can be transmitted to the state control circuit 32.

<Configuration Example 3 for Obtaining Data on End of Task>

FIG. 5 illustrates a configuration example different from that illustrated in FIG. 4. The configuration illustrated in FIG. 5 differs from that illustrated in FIG. 4 in that the programmable area 22 is not included. In the configuration in FIG. 5, data with which whether a task of a PLD 21B is completed or not can be determined is stored in advance in the configuration ROM that determines the circuit configuration of the programmable area 23.

For example, when specific arithmetic processing is performed, the number of clocks required for the arithmetic processing is determined; therefore, a circuit that counts a count value in the arithmetic processing is configured in the programmable area 23. Accordingly, the signal task which is data indicating the end of the task by the PLD 21B can be generated.

Specifically, in the case where the PLD 21B performs 32 bits×32 bits multiplication processing that is completed at a maximum of 32 clocks, the high-level signal task is output to the signal line TASK at the time when the count value becomes 32, whereby data on whether the task of the PLD 21B is completed or not can be transmitted to the state control circuit 32.

This embodiment can be combined with any of the other embodiments as appropriate.

(Embodiment 2)

Figure 6:
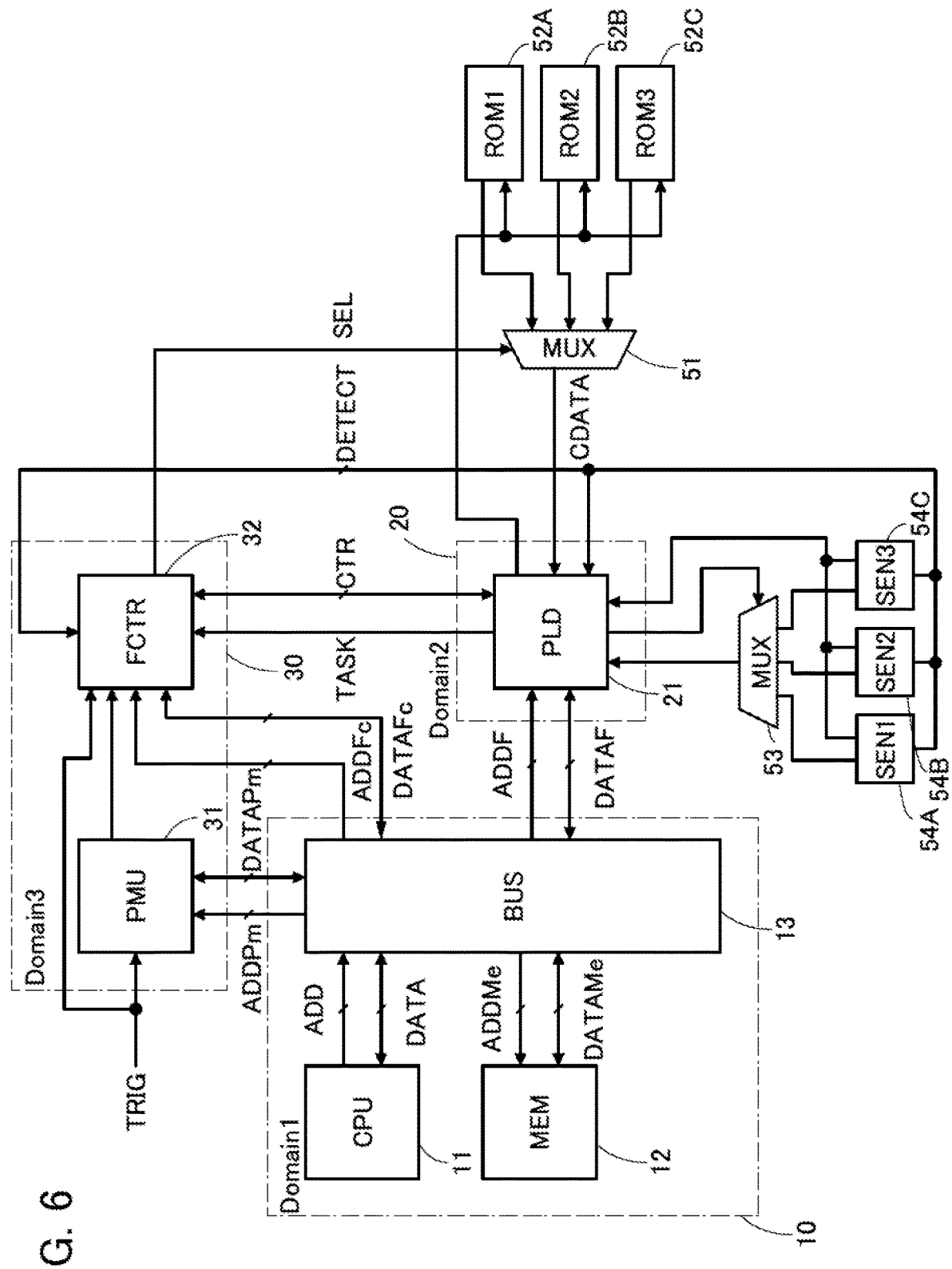
FIG. 6 is a block diagram illustrating one embodiment of the present invention.

FIG. 6 illustrates a configuration example different from that in FIG. 1. The configuration illustrated in the block diagram of FIG. 6 differs from the configuration in FIG. 1 in that a multiplexer 53 ("MUX" in the diagram) and sensor modules 54A, 54B, and 54C ("SEN1", "SEN2", and "SEN3" in the diagram) are included.

Each of the sensor modules 54A to 54C is, for example, an illumination sensor, a color sensor, an acceleration sensor, a distortion sensor, a thermal sensor, a pressure sensor, a distance sensor, or the like.

The PLD 21 has a function of performing arithmetic processing of an output value output from each of the sensor modules 54A to 54C and outputting data to the CPU 11. The PLD 21 selects a signal of a specific sensor module among the sensor modules 54A to 54C using the multiplexer 53 in accordance with a circuit configuration determined by data from the state control circuit 32 and the configuration ROMs 52A to 52C.

The sensor modules 54A to 54C each have a function of detecting a specific change. The sensor modules can transmit data on whether there is a change or not to the state control circuit 32. In the case where a specific change is detected in the sensor modules, a signal detect on whether there is a change or not is transmitted to the state control circuit 32 through a wiring DETECT. In the case where any of the sensor modules is an acceleration sensor, when a physical change is detected by the acceleration sensor, for example, the signal detect is transmitted through the wiring DETECT.

The state control circuit 32 can make the PLD 21 start a task through the signal bus CTR in accordance with the signal detect. In this case, the task means performing desired arithmetic processing on any of output values output from the sensor modules.

As described above, in the case where the task is completed by the PLD 21, the signal task indicating the end of the task is transmitted to the state control circuit 32 through the signal line TASK, data in the registers in the PLD 21 is saved in the nonvolatile region, and then the PLD 21 can be turned off.

Note that in the configuration in this embodiment, the CPU 11 does not necessarily obtain data on a timing at which the PLD 21 starts a task.

In the case where the CPU 11 does not obtain data on the timing at which the task is started by the PLD 21, it is effective that the CPU 11 monitors a specific register in the state control circuit 32 periodically to check whether the task of the PLD 21 is completed or not.

In the case of using the system illustrated in FIG. 6, the PLD 21 can be turned on to perform arithmetic processing only when a change is detected by the sensor module. After the end of the arithmetic processing, the PLD 21 can be turned off, and the result of the arithmetic processing can be transmitted at a timing at which a request is made by the CPU 11.

This embodiment can be combined with any of the other embodiments as appropriate.

(Embodiment 3)

In this embodiment, a configuration example of a PLD that can be used in each of the semiconductor devices described in the above embodiments is described.

<Configuration Example of PLD>

Figure 7:
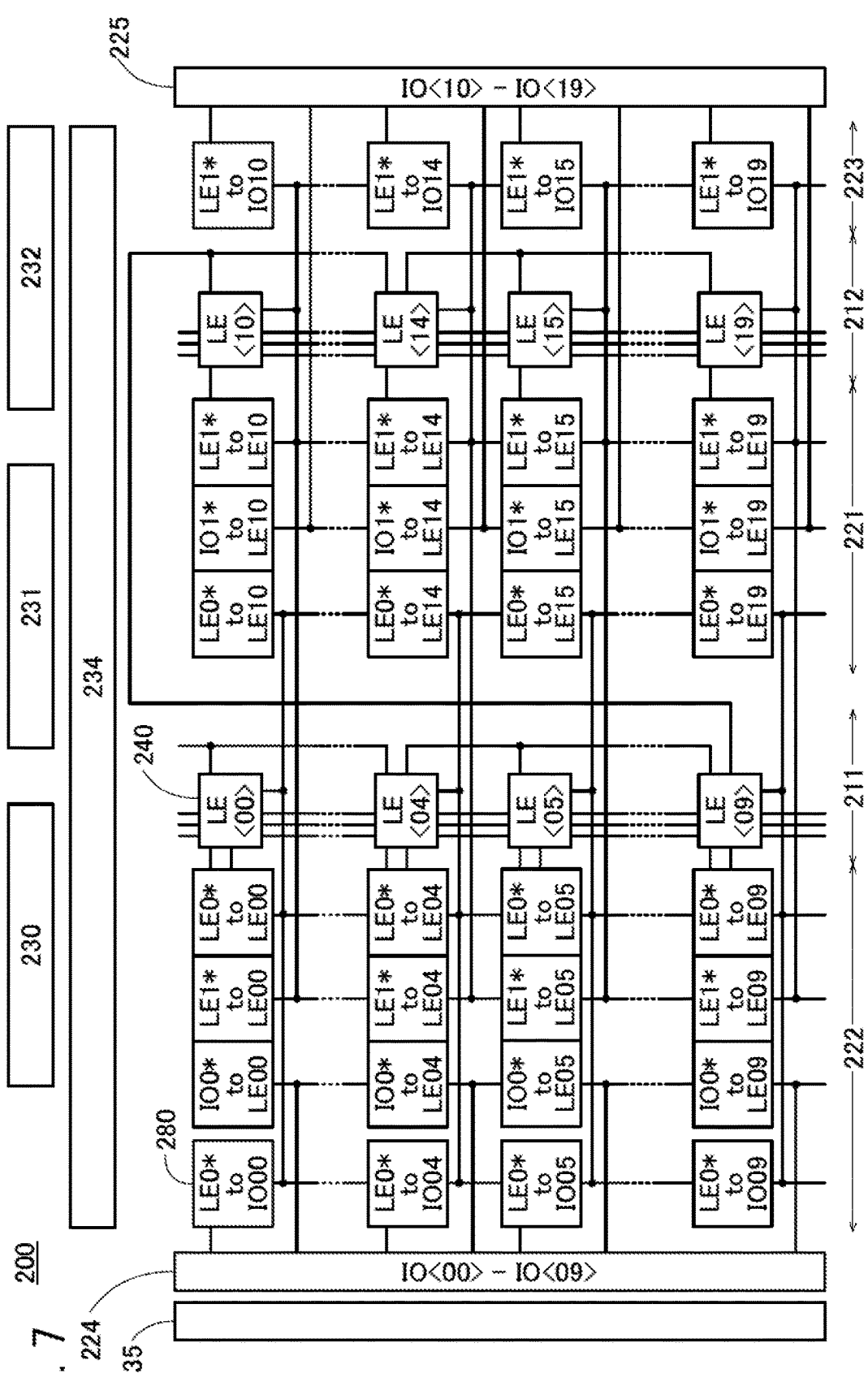
FIG. 7 is a diagram illustrating a configuration example of a PLD.

FIG. 7 illustrates a configuration of a PLD 200. The PLD 200 can be used as the PLD 21 of Embodiment 1. A multi-context method can be applied to the PLD 200.

The PLD 200 includes a logic unit, an input/output unit, and a peripheral circuit unit. The logic unit includes logic arrays (LAs) 211 and 212 and switch arrays (SWAs) 221 to 223. The input/output unit includes input/output arrays (IOAs) 224 and 225. The peripheral circuit unit includes circuits having a function of driving the logic unit and the input/output unit. For example, the peripheral circuit unit includes a clock signal generator 230, a configuration controller 231, a context controller 232, a column driver circuit 234, and a row driver circuit 235.

The LAs 211 and 212 each include a plurality of LEs 240. In the example of FIG. 7, the LA 211 includes 10 LEs 240 (LE<00> to LE<09>), and the LA 212 includes 10 LEs 240 (LE<10> to LE<19>); however, the number of LEs 240 can be determined freely. The IOAs 224 and 225 have a function of controlling input and output of signals between external terminals of the PLD 200 and the LAs 211 and 212.

The IOAs 224 and 225 each include a plurality of input/output circuits (IOs). In the example of FIG. 7, the IOA 224 includes 10 input/output circuits (IO<00> to IO<09>), and the IOA 225 includes 10 input/output circuits (IOs<10> to <19>). The IO<00> to IO<19> are connected to different external terminals from one another.

The SWAs 221 to 223 each include a plurality of RSs 280. The expressions in the RSs 280 in the drawing represent the functions of the RSs 280. For example, an RS 280 expressed as "LE0* to IO00" has a function of a switch between the output nodes of the LE<00> to LE <09> and the input node of the IO<00>, and determines the connection between the LE<00> to LE<09> and the IO<00> in accordance with configuration data and data for selecting a context (also referred to as context data below).

The clock signal generator 230 has a function of generating one or more clock signals used in the PLD 200. The column driver circuit 234 has a function of generating configuration data. The row driver circuit 235 has a function of generating a signal for selecting a configuration memory. The configuration controller 231 has a function of controlling the column driver circuit 234 and the row driver circuit 235. The context controller 232 has a function of generating context data.

<Configuration Example of LE>

Figure 8:
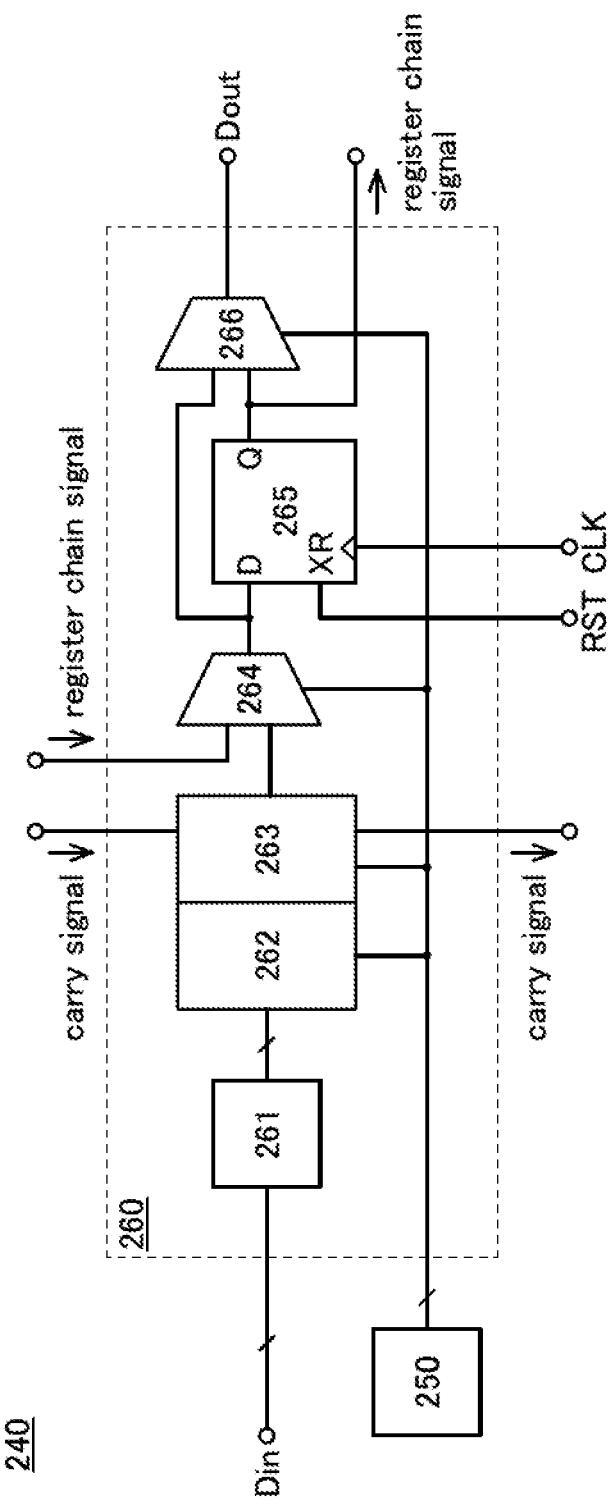
FIG. 8 is a diagram illustrating a configuration example of an LE.

FIG. 8 illustrates a configuration example of the LE 240. The LE 240 is a programmable logic circuit and includes a configuration memory unit 250 and a logic cell (LCELL) 260.

The configuration memory unit 250 has a function of storing configuration data. The function of the LE 240 is determined in accordance with configuration data stored in the configuration memory unit 250.

The LE 240 has a function of generating data by subjecting input data Din to a predetermined logical operation and outputting the data as output data Dout. The LE 240 includes an exclusive OR (XOR) circuit group 261, a LUT 262, a carry logic 263, a selector (SEL) 264, a flip-flop circuit (FF) 265, and a selector (SEL) 266. The FF 265 has a function of a register. The FF 265 includes a terminal D to which data is input, a terminal XR to which a reset signal RST is input, a terminal to which a clock signal CLK is input, and a terminal Q from which data is output. The logic function of the LCELL 260 is controlled by the configuration data output from the configuration memory unit 250.

The data Din is input from an RS 280. Furthermore, the data Dout is output to another RS 280. In the case where a carry chain is formed with a plurality of LEs 240, input and output of carry signals are performed between the plurality of LEs 240. In the case where a register chain is formed with a plurality of LEs 240, input and output of register chain signals are performed between the adjacent LEs 240.

<Configuration Example of Configuration Memory>

The LEs 240 and the RSs 280 in the PLD 200 each include a configuration memory. Configuration examples of a configuration memory that can be used in the LEs 240 or the RSs 280 are described below.

A configuration memory includes a memory circuit having a function of storing configuration data. The memory circuit included in the configuration memory may be volatile or nonvolatile. Examples of the volatile memory circuit include an SRAM. Examples of the nonvolatile memory circuit include a flash memory, a ferroelectric random access memory (FeRAM), a magnetoresistive random access memory (MRAM), a phase change random access memory (PRAM), and a resistive random access memory (ReRAM).

Here, it is particularly preferable to use a circuit which includes a transistor including an oxide semiconductor in a channel formation region (also referred to as an OS transistor below) as the memory circuit. An oxide semiconductor has a wider band gap and a lower carrier density than other semiconductors such as silicon, and thus the off-state current of an OS transistor is extremely low. When such an OS transistor is included in a configuration memory, the configuration memory can retain configuration data for a significantly long period, and in addition, as described below, the area of the configuration memory can be reduced.

[Configuration Example 1]

Figure 9A:
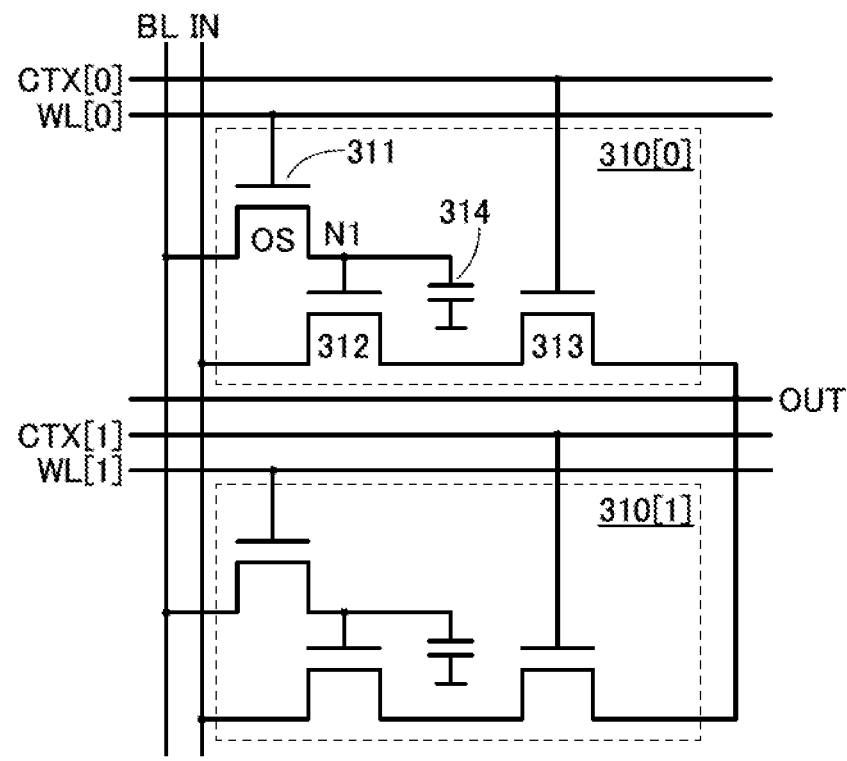
FIGS. 9A and 9B are diagrams each illustrating a configuration example of a circuit.

FIG. 9A illustrates a configuration example of a memory circuit that can be used as a configuration memory. A memory circuit 300 includes a plurality of circuits 310. Although two circuits 310 (circuits 310[0] and 310[1]) are illustrated in the example illustrated in FIG. 9A, the number of circuits 310 is not limited to two. Predetermined configuration data is stored in the circuit 310; thus, the connection between a wiring IN and a wiring OUT can be controlled. Therefore, the memory circuit 300 can be used as the RS 280.

The circuit 310 includes transistors 311, 312, and 313 and a capacitor 314. Although the transistors 311, 312, and 313 are of an n-channel type here, they may be of a p-channel type. A transistor marked with "OS" is an OS transistor.

A gate of the transistor 311 is connected to a wiring WL, one of a source and a drain of the transistor 311 is connected to a gate of the transistor 312 and one electrode of the capacitor 314, and the other thereof is connected to a wiring BL. One of a source and a drain of the transistor 312 is connected to the wiring IN, and the other thereof is connected to one of a source and a drain of the transistor 313. A gate of the transistor 313 is connected to a wiring CTX, and the other of the source and the drain of the transistor 313 is connected to the wiring OUT. The other electrode of the capacitor 314 is connected to a wiring to which a predetermined potential is supplied. Here, a node which is connected to the one of the source and the drain of the transistor 311, the gate of the transistor 312, and the one electrode of the capacitor 314 is referred to as a node N1.

Next, an operation of the circuit 310 is described. First, the potential of the wiring WL is set to turn on the transistor 311. A potential of the wiring BL is supplied to the node N1 (writing of configuration data). Note that the wiring WL is connected to the row driver circuit 235 (see FIG. 7). The potential of the wiring WL can be controlled by the row driver circuit 235.

Next, the potential of the wiring WL is set to turn off the transistor 311, whereby the node N1 is brought into a floating state and the potential at the node N1 is held (retention of configuration data). Here, the conduction state of the transistor 312 provided between the wiring IN and the wiring OUT is determined by the potential of the node N1. Accordingly, the conduction state between the wiring IN and the wiring OUT can be controlled by the control of the potential of the node N1. Since the memory circuit 300 including such a circuit 310 functions as a switch for controlling the conduction state between wirings, the memory circuit 300 can be used as a configuration memory of the RS 280. In the case where the memory circuit 300 is used as a configuration memory of the RS 280, the wiring IN and the wiring OUT are connected to the IO and the LE 240, respectively.

Note that the memory circuit 300 includes the circuit 310[0] and the circuit 310[1] which share the wiring OUT. By the supply of predetermined potentials to the wirings CTX[0] and CTX[1], one of the circuit 310[0] and the circuit 310[1] can be selected. Thus, the memory circuit 300 can be used as a multi-context configuration memory.

Specifically, when the context [0] is selected, the wiring CTX[0] is set to turn on the transistor 313 of the circuit 310[0]. In addition, the wiring CTX[1] is set to turn off the transistor 313 of the circuit 310[1]. In this way, the conduction state between the wiring IN and the wiring OUT is controlled by the potential of the node N1 in the circuit 310[0]. In the case where the context [1] is selected, the wiring CTX[0] is set to turn off the transistor 313 of the circuit 310[0] and the wiring CTX[1] is set to turn on the transistor 313 of the circuit 310[1]. In this way, the conduction state between the wiring IN and the wiring OUT is controlled by the potential of the node N1 in the circuit 310[1]. Thus, the context for controlling the conduction state between the wiring IN and the wiring OUT can be selected by controlling the potentials of the wirings CTX[0] and CTX[1].

Here, the transistor 311 is an OS transistor and has an extremely low off-state current. Therefore, the potential of the node N1 can be kept for a long time in a period when the transistor 311 is in an off state. Consequently, the frequency of updates of configuration data can be drastically reduced, whereby power consumption of the PLD 200 can be reduced. Moreover, even in a period when the power supply to the circuit 310 is stopped, configuration data can be retained for a long time.

Moreover, by using an OS transistor, the circuit 310 can be formed of fewer transistors (three transistors in the circuit 310). Consequently, the area of the PLD 200 can be reduced. Furthermore, an OS transistor can be stacked over another transistor. When the transistor 311 is stacked over the transistor 312 or the transistor 313, the area of the circuit 310 can be reduced; as a result, the area of the PLD 200 can be further reduced.

Moreover, in the case where a multi-context method is used in the PLD 200, configuration data corresponding to a plurality of contexts needs to be stored in a configuration memory, which might cause a significant increase of the area of the configuration memory. However, as described above, usage of the memory circuit 300 including an OS transistor can suppress the increase of the area of the configuration memory. For these reasons, it is particularly preferable to use an OS transistor in the PLD 200 employing the multi-context method.

Note that materials of the transistors other than the OS transistor are not particularly limited in FIG. 9A. For example, a transistor whose channel formation region is formed in part of a substrate including a single crystal semiconductor (the transistor is also referred to as a single crystal transistor below) may be used. As the substrate including a single crystal semiconductor, a single crystal silicon substrate, a single crystal germanium substrate, or the like can be given. Since the single crystal transistor can perform high-speed operation, the use of the single crystal transistor in the memory circuit allows the memory circuit to operate at higher speed. As each of the transistors other than the OS transistor, a transistor whose channel formation region is formed in a film including a semiconductor other than an oxide semiconductor can also be used. Examples of the semiconductor other than an oxide semiconductor include silicon, germanium, silicon germanium, silicon carbide, gallium arsenide, aluminum gallium arsenide, indium phosphide, gallium nitride, and an organic semiconductor. Each of the above semiconductors other than an oxide semiconductor may be a single crystal semiconductor or a non-single-crystal semiconductor such as an amorphous semiconductor, a microcrystalline semiconductor, or a polycrystalline semiconductor. These transistors can be used as the transistors other than the OS transistor described below.

Figure 9B:
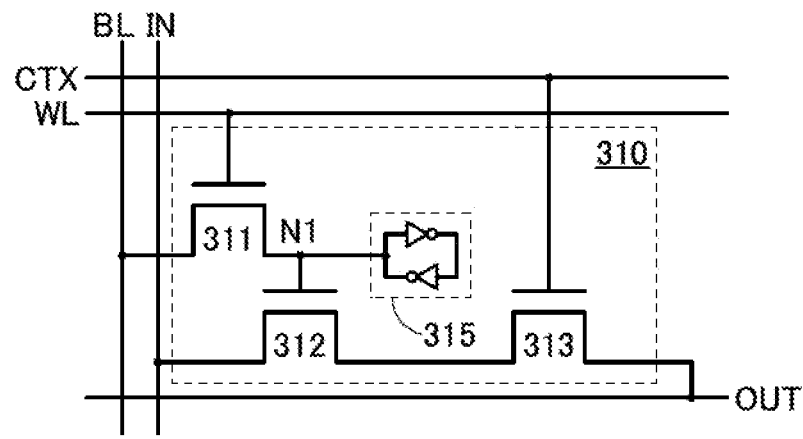

FIG. 9B illustrates another configuration example of the circuit 310. The circuit 310 illustrated in FIG. 9B has a configuration including a circuit 315 instead of the capacitor 314 of FIG. 9A. The circuit 315 forms an inverter loop. The potential of the node N1 can be kept to be a high-level potential or a low-level potential by the circuit 315. Note that the above-described transistors other than the OS transistor can be used as the transistor 311. In this case, the circuit 310 is volatile.

[Configuration Example 2]

Figure 10:
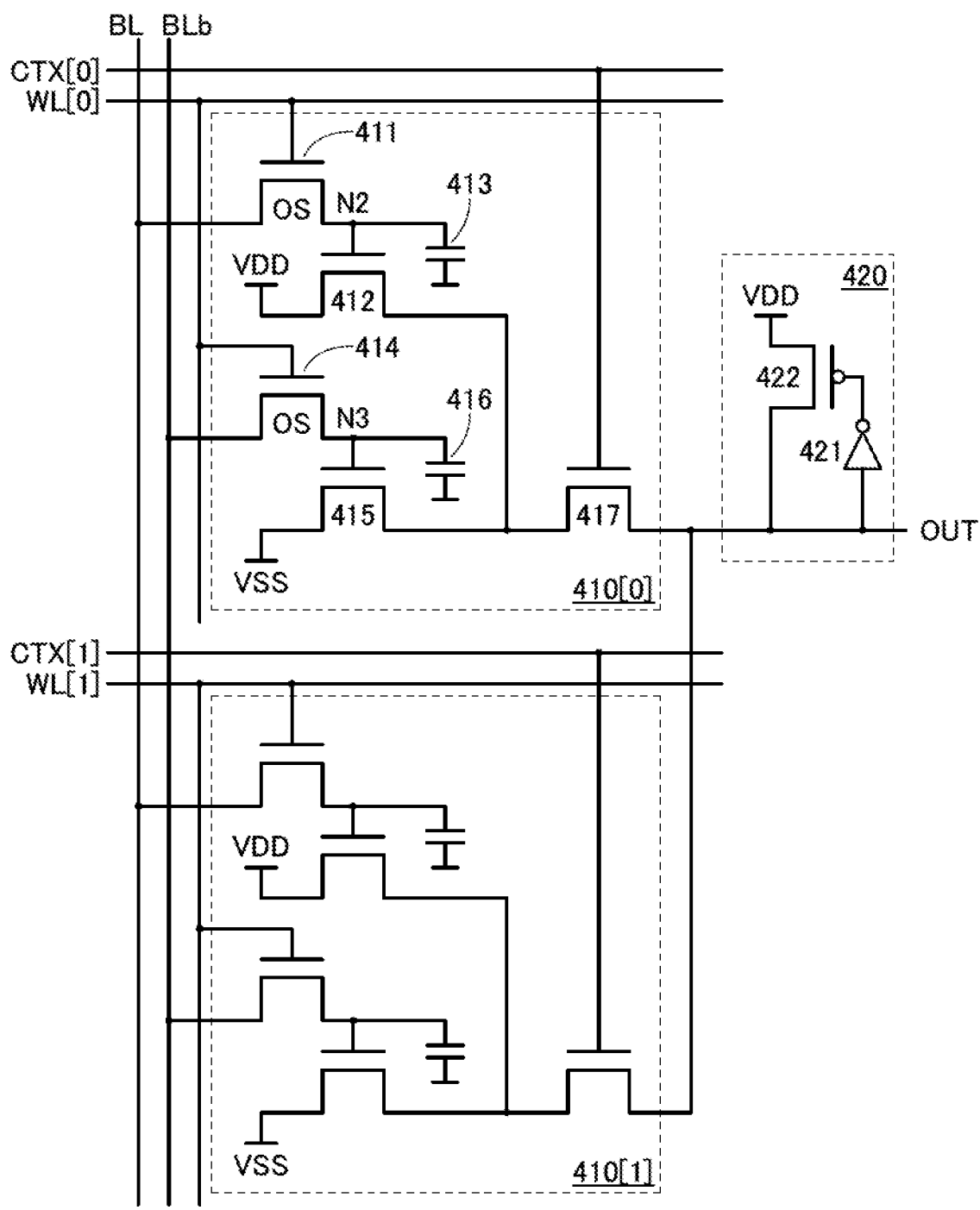
FIG. 10 is a diagram illustrating a configuration example of a circuit.

FIG. 10 illustrates a configuration example of another memory circuit that can be used as the configuration memory. A memory circuit 400 includes circuits 410. Although two circuits 410 (circuits 410[0] and 410[1]) are illustrated in the example illustrated in FIG. 10, the number of circuits 410 is not limited to two.

The circuit 410 includes transistors 411 and 412, a capacitor 413, transistors 414 and 415, a capacitor 416, and a transistor 417. Although the transistors 411, 412, 414, 415, and 417 are of an n-channel type here, they may be of a p-channel type.

A gate of the transistor 411 is connected to a wiring WL, one of a source and a drain of the transistor 411 is connected to a gate of the transistor 412 and one electrode of the capacitor 413, and the other thereof is connected to a wiring BL. One of a source and a drain of the transistor 412 is connected to a wiring to which a predetermined potential (here, a high power supply potential VDD) is supplied, and the other thereof is connected to one of a source and a drain of the transistor 417. The other electrode of the capacitor 413 is connected to a wiring to which a predetermined potential is supplied. A gate of the transistor 414 is connected to the wiring WL, one of a source and a drain of the transistor 414 is connected to a gate of the transistor 415 and one electrode of the capacitor 416, and the other of the source and the drain of the transistor 414 is connected to a wiring BLb. One of a source and a drain of the transistor 415 is connected to a wiring to which a predetermined potential (here, a low power supply potential VSS, e.g., a ground potential) is supplied, and the other of the source and the drain of the transistor 415 is connected to one of the source and the drain of the transistor 417. The other electrode of the capacitor 416 is connected to a wiring to which a predetermined potential is supplied. A gate of the transistor 417 is connected to a wiring CTX, and the other of the source and the drain of the transistor 417 is connected to the wiring OUT.

Here, a node which is connected to the one of the source and the drain of the transistor 411, the gate of the transistor 412, and the one electrode of the capacitor 413 is referred to as a node N2. Furthermore, a node which is connected to the one of the source and the drain of the transistor 414, the gate of the transistor 415, and the one electrode of the capacitor 416 is referred to as a node N3. Note that an inversion signal of a signal that is supplied to the wiring BL is supplied to the wiring BLb.

A high-level potential is stored in one of the node N2 and the node N3 as configuration data, and a low-level potential is stored in the other of the node N2 and the node N3 as configuration data. Accordingly, one of the transistors 412 and 415 is on, and the other thereof is off. Thus, a high- or low-level potential can be selectively supplied to the wiring OUT. Since the memory circuit 400 including such a circuit 410 has a function of controlling a logical value output to the wiring OUT, the memory circuit 400 can be used as a configuration memory of the LE 240. In the case where the memory circuit 400 is used as a configuration memory of the LE 240, the wiring OUT is connected to other logic circuits, the RS 280, and the like. Note that storing the configuration data in the node N2 and the node N3 can be performed by an operation similar to the operation of the circuit 310 in FIG. 9A.

Note that the memory circuit 400 includes the circuit 410[0] and the circuit 410[1] which share the wiring OUT. By the supply of predetermined potentials to the wirings CTX[0] and CTX[1], one of the circuit 410[0] and the circuit 410[1] can be selected. Thus, the memory circuit 300 can be used as a multi-context configuration memory.

Specifically, when the context [0] is selected, the wiring CTX[0] is set to turn on the transistor 417 of the circuit 410[0]. In addition, the wiring CTX[1] is set to turn off the transistor 417 of the circuit 410[1]. In this way, the potential of the wiring OUT is controlled by the potentials of the nodes N2 and N3 in the circuit 410[0]. In the case where the context [1] is selected, the wiring CTX[0] is set to turn off the transistor 417 of the circuit 410[0] and the wiring CTX[1] is set to turn on the transistor 417 of the circuit 410[1]. In this way, the potential of the wiring OUT is controlled by the potentials of the nodes N2 and N3 in the circuit 410[1]. Thus, the context for controlling the potential of the wiring OUT can be selected by controlling the potentials of the wirings CTX[0] and CTX[1].

In the circuit 410, OS transistors are used as the transistors 411 and 414. Therefore, power consumption and the area can be reduced in the circuit 410, as in the circuit 310.

Furthermore, the memory circuit 400 may include a circuit 420. The circuit 420 includes an inverter 421 and a transistor 422. An input terminal and an output terminal of the inverter 421 are connected to the wiring OUT and a gate of the transistor 422, respectively. One of a source and a drain of the transistor 422 is connected to the wiring OUT, and the other thereof is connected to a wiring to which a predetermined potential (here, a high power supply potential VDD) is supplied. The circuit 420 has a function of retaining the potential of the wiring OUT, whereby the wiring OUT can be prevented from being floating. Thus, the potential of the wiring OUT can be prevented from being the intermediate potential, and generation of a shoot-through current in a circuit element connected to the wiring OUT can be avoided.

Figure 11A:
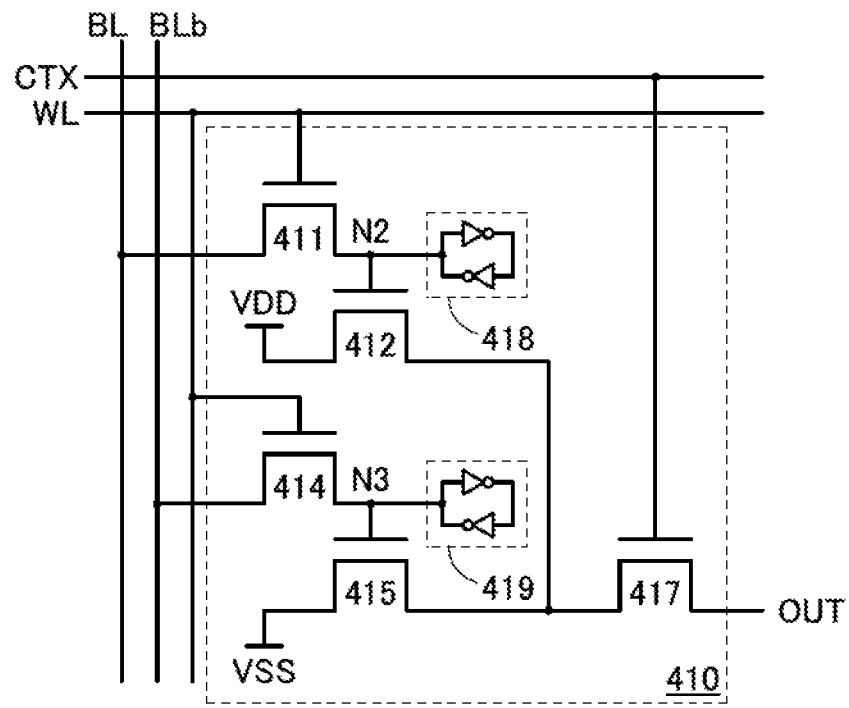
FIGS. 11A and 11B are diagrams each illustrating a configuration example of a circuit.
Figure 11B:
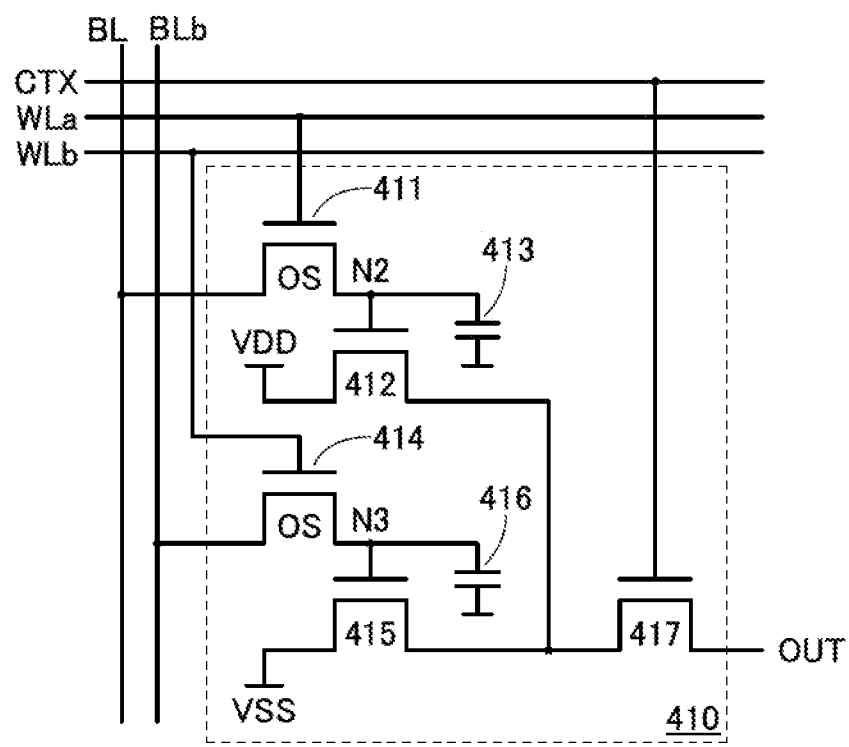

FIGS. 11A and 11B each illustrate another configuration example of the circuit 410. The circuit 410 illustrated in FIG. 11A has a configuration including circuits 418 and 419 instead of the capacitors 413 and 416 of FIG. 10. The circuits 418 and 419 each form an inverter loop. The potential of the node N2 can be kept to be a high-level potential or a low-level potential by the circuit 418, and the potential of the node N3 can be kept to be a high-level potential or a low-level potential by the circuit 419. Note that the above-described transistors other than the OS transistor can be used as the transistors 411 and 414. In this case, the circuit 410 is volatile.

Although the gate of the transistor 411 and the gate of the transistor 414 are connected to the same wiring WL in FIG. 10 and FIG. 11A, they may be connected to different wirings. FIG. 11B illustrates a configuration in which the gate of the transistor 411 is connected to a wiring WLa and the gate of the transistor 414 is connected to a wiring WLb.

[Configuration Example 3]

Figure 12:
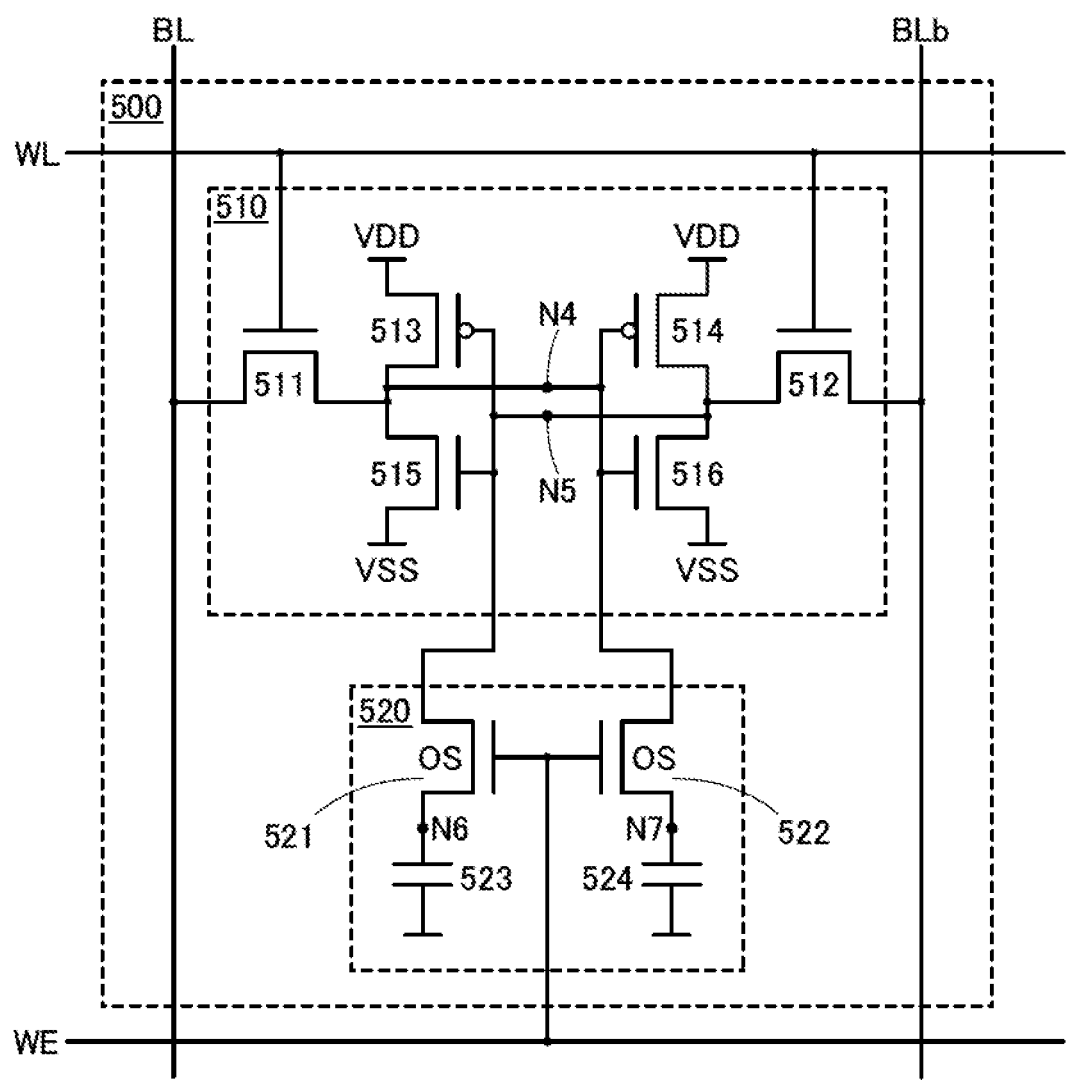
FIG. 12 is a diagram illustrating a configuration example of a circuit.

A circuit in which a nonvolatile memory and an OS transistor are combined can be used as the configuration memory. FIG. 12 illustrates a configuration example of such a memory circuit. A configuration example of a memory circuit 500 is illustrated. The memory circuit 500 includes a circuit 510 and a circuit 520. Note that the memory circuit 500 can be used as the transistor 311 and the circuit 315 in FIG. 9B, the transistor 411 and the circuit 418 in FIG. 11A, or the transistor 414 and the circuit 419 in FIG. 11A, for example.

The circuit 510 includes transistors 511 to 516. The transistors 511, 512, 515, and 516 are of an n-channel type, and the transistors 513 and 514 are of a p-channel type. Note that the transistors 511 and 512 may each be either an n-channel transistor or a p-channel transistor.

A gate of the transistor 511 is connected to a wiring WL. One of a source and a drain of the transistor 511 is connected to one of a source and a drain of the transistor 513, one of a source and a drain of the transistor 515, a gate of the transistor 514, and a gate of the transistor 516. The other of the source and the drain of the transistor 511 is connected to a wiring BL. A gate of the transistor 512 is connected to the wiring WL. One of a source and a drain of the transistor 512 is connected to one of a source and a drain of the transistor 514, one of a source and a drain of the transistor 516, a gate of the transistor 513, and a gate of the transistor 515. The other of the source and the drain of the transistor 512 is connected to a wiring BLb. The other of the source and the drain of the transistor 513 and the other of the source and the drain of the transistor 514 are each connected to a wiring to which a predetermined potential (here, a high power supply potential VDD) is supplied. The other of the source and the drain of the transistor 515 and the other of the source and the drain of the transistor 516 are each connected to a wiring to which a predetermined potential (here, a low power supply potential VSS) is supplied. A node which is connected to the gate of the transistor 513 and the gate of the transistor 515 is referred to as a node N5, and a node which is connected to the gate of the transistor 514 and the gate of the transistor 516 is referred to as a node N4.

In this manner, the circuit 510 has the configuration of an SRAM cell, which is a volatile memory. The node N4 and the node N5 correspond to the nodes where configuration data is retained.

The circuit 520 includes transistors 521 and 522 and capacitors 523 and 524. Here, the transistors 521 and 522 are OS transistors.

A gate of the transistor 521 is connected to a wiring WE, one of a source and a drain of the transistor 521 is connected to one electrode of the capacitor 523, and the other of the source and the drain of the transistor 521 is connected to the node N5. A gate of the transistor 522 is connected to the wiring WE, one of a source and a drain of the transistor 522 is connected to one electrode of the capacitor 524, and the other of the source and the drain of the transistor 522 is connected to the node N4. The other electrode of the capacitor 523 and the other electrode of the capacitor 524 are each connected to a wiring to which a predetermined potential is supplied. The wiring to which a predetermined potential is supplied may be either a high-potential power supply line or a low-potential power supply line (e.g., a ground line). Alternatively, a wiring whose potential can be changed may be used. A node which is connected to the one of the source and the drain of the transistor 521 and the one electrode of the capacitor 523 is referred to as a node N6, and a node which is connected to the one of the source and the drain of the transistor 522 and the one electrode of the capacitor 524 is referred to as a node N7.

In the memory circuit 500, the node N4 corresponding to the node at which data is retained is connected to the node N7 through the transistor 522 which is the OS transistor. Similarly, in the memory circuit 500, the node N5 corresponding to the node at which data is retained is connected to the node N6 through the transistor 521 which is an OS transistor. Thus, the data retained in the circuit 510, which has the configuration of an SRAM cell, can be saved to the node N6 and the node N7. Furthermore, the data that has been saved can be restored to the circuit 510.

Specifically, in a period where no data is written to or read from the circuit 510, the potential of the wiring WE is set to the high level to turn on the transistors 521 and 522, whereby the data retained at the node N4 and the data retained at the node N5 can be saved to the node N7 and the node N6, respectively. After that, the potential of the wiring WE is set to the low level to turn off the transistors 521 and 522, whereby the potentials of the nodes N6 and N7 are retained. Then, the potential of the wiring WE is set to the high level again to turn on the transistors 521 and 522, whereby the data that have been saved to the nodes N6 and N7 can be restored to the nodes N4 and N5. By making the high power supply potential VDD high at the time of data saving and low at the time of data restoration, data saving and restoration can be performed more stably.

Here, the transistors 521 and 522 are OS transistors and have extremely low off-state current. Therefore, when the transistors 521 and 522 are in the off state, the potential of the node N6 and the potential of the node N7 can be retained for a long time. Therefore, by saving the data retained at the nodes N4 and N5 to the nodes N6 and N7 immediately before power supply to the memory circuit 500 is stopped, the data stored in the memory circuit 500 can be retained even when the power supply to the memory circuit 500 is stopped. After the power supply to the memory circuit 500 is restarted, the data retained at the nodes N6 and N7 can be restored to the nodes N4 and N5.

Since the memory circuit 500 has the configuration of an SRAM cell, the transistors 511 to 516 are required to operate at high speed. Therefore, transistors including silicon in their channel formation regions (also referred to as Si transistors below) or the like are preferably used as the transistors 511 to 516.

In addition, in a period when power is supplied to the memory circuit 500 and the circuit 510 operates as an SRAM cell, the transistors 521 and 522 are preferably in the off state. This can prevent a hindrance to a high-speed operation of the circuit 510.

Although FIG. 12 illustrates an example in which the circuit 520 includes the transistors 521 and 522 and the capacitors 523 and 524, the transistor 521 and the capacitor 523 may be omitted, or the transistor 522 and the capacitor 524 may be omitted.

In FIG. 12, an SRAM cell including six transistors, which is a volatile memory cell, is used as the circuit 520; however, the configuration is not limited thereto, and a different volatile memory cell may be used as the circuit 520. Also in the case where a volatile memory cell different from the SRAM cell including six transistors is used, an OS transistor and a capacitor which are connected to the volatile memory cell as in FIG. 12 make it possible to save and restore data.

In the above-described manner, in the memory circuit 500, data stored in the circuit 510 is saved to and retained by the circuit 520; thus, the data can be retained even in a period where power is not supplied to the memory circuit 500. Furthermore, after the power supply is restarted, the data retained by the circuit 520 can be restored to the circuit 510. Accordingly, the power supply to the memory circuit 500 can be stopped in the data retention period, which can reduce the power consumption.

Moreover, an OS transistor can be stacked over a Si transistor. Therefore, the circuit 520 can be stacked over the circuit 510. Accordingly, an increase in the area of the memory circuit 500 can be suppressed.

[Configuration Example 4]

Figure 13A:
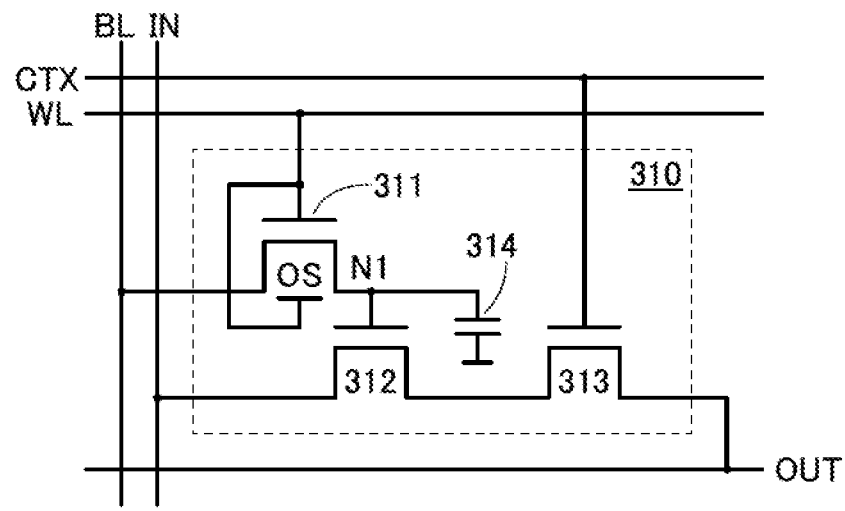
FIGS. 13A and 13B are diagrams each illustrating a configuration example of a circuit.
Figure 13B:
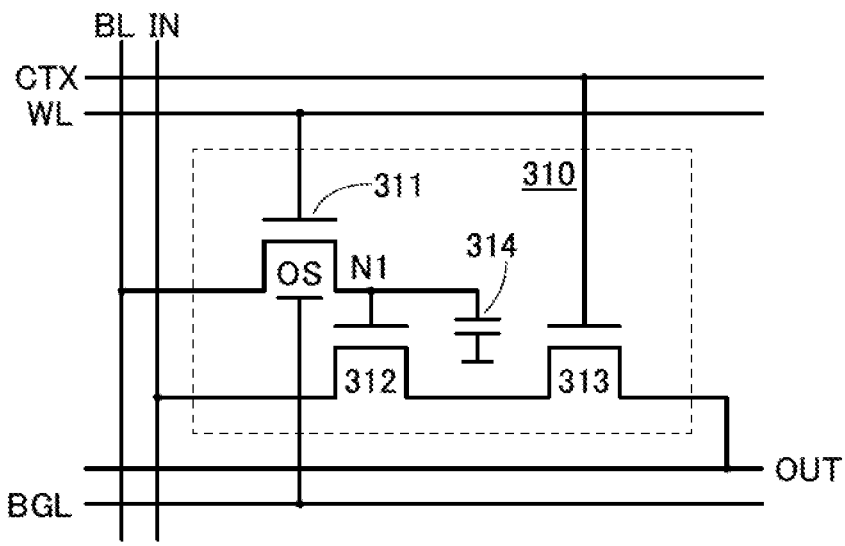

The OS transistor described in this embodiment may include a pair of gates. Taking the circuit 310 illustrated in each of FIGS. 9A and 9B as an example, the configurations in which the OS transistor is provided with a pair of gates are illustrated in FIGS. 13A and 13B. Note that one of a pair of gates in a transistor can be referred to as a front gate or, simply, a gate, and the other thereof can be referred to as a backgate.

The transistor 311 illustrated in FIG. 13A includes a backgate which is connected to the front gate. In this case, the potential of the front gate is equal to the potential of the backgate.

The transistor 311 illustrated in FIG. 13B includes a backgate connected to a wiring BGL. The wiring BGL has a function of supplying a predetermined potential to the backgate. The threshold voltage of the transistor 311 can be controlled by controlling the potential of the wiring BGL. The wiring BGL can be connected to the row driver circuit 235 (see FIG. 7). The potential of the wiring BGL can be controlled by the row driver circuit 235. Furthermore, the wiring BGL is shared by the circuits 310 in the same row.

Although the examples in which the backgate is provided in the transistor 311 of the circuit 310 are illustrated in FIGS. 13A and 13B, any of the OS transistors in this embodiment can similarly be provided with a backgate.

As described above, using an OS transistor in a configuration memory in one embodiment of the present invention enables reductions in the area and power consumption of the PLD.

This embodiment can be combined with any of the other embodiments as appropriate.

<Notes on Description of this Specification and the Like>

In this specification and the like, ordinal numbers such as "first", "second", and "third" are used in order to avoid confusion among components. Thus, the terms do not limit the number or order of components.

Furthermore, in a block diagram in this specification and the like, components are functionally classified and shown by blocks that are independent of each other. However, in an actual circuit and the like, such components are sometimes hard to classify functionally, and there is a case in which one circuit is concerned with a plurality of functions or a case in which a plurality of circuits are concerned with one function. Therefore, blocks in a block diagram do not necessarily show components described in the specification, which can be explained with another term as appropriate depending on the situation.

The same elements or elements having similar functions, elements formed using the same material, elements formed at the same time, or the like in the drawings are denoted by the same reference numerals, and the description thereof is not repeated in some cases.

In this specification or the like, the terms "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, "voltage" and "potential" can be replaced with each other. The term "voltage" refers to a potential difference from a reference potential. When the reference potential is a ground potential, for example, "voltage" can be replaced with "potential." The ground potential does not necessarily mean 0 V. Potentials are relative values, and the potential applied to a wiring or the like is changed depending on the reference potential, in some cases.

In this specification and the like, a switch is conducting (on state) or not conducting (off state) to determine whether current flows therethrough or not. Alternatively, a switch has a function of selecting and changing a current path.

Examples of a switch are an electrical switch, a mechanical switch, and the like. That is, any element can be used as a switch as long as it can control current, without limitation to a certain element.

In the case of using a transistor as a switch, an "on state" of the transistor refers to a state in which a source and a drain of the transistor are electrically short-circuited. Furthermore, an "off state" of the transistor refers to a state in which the source and the drain of the transistor are electrically disconnected. In the case where a transistor operates just as a switch, the polarity (conductivity type) of the transistor is not particularly limited to a certain type.

In this specification and the like, when it is described that "A and B are connected to each other", the case where A and B are electrically connected to each other is included in addition to the case where A and B are directly connected to each other. Here, the expression "A and B are connected" means that electric signals can be transmitted and received between A and B when an object having any electric action exists between A and B.

REFERENCE NUMERALS

N1: node, N2: node, N3: node, N4: node, N5: node, N6: node, N7: node, power 1: signal, power 2: signal, ROM3:

ROM, SEN3: SEN, T0: time, T1: time, T2: time, T3: time, T4: time, T5: time, T6: time, T7: time, T8: time, T9: time, 10: power domain, 11: CPU, 12: memory, 13: bus, 20: power domain, 21: PLD, 21A: PLD, 21B: PLD, 22: programmable area, 23: programmable area, 24: control circuit, 25: bit line driver circuit, 26: word line driver circuit, 30: power domain, 31: power management unit, 32: state control circuit, 51: multiplexer, 52A: configuration ROM, 52C: configuration ROM, 53: multiplexer, 54A: sensor module, 54C: sensor module, 60: state, 61: state, 62: state, 63: state, 64: state, 65: state, 66: state, 67: state, 68: state, 69: state, 70: state, 200: PLD, 211: LA, 212: LA, 221: SWA, 223: SWA, 224: IOA, 225: IOA, 230: clock signal generator, 231: configuration controller, 232: context controller, 234: column driver circuit, 235: row driver circuit, 240: LE, 250: configuration memory unit, 260: LCELL, 261: circuit group, 262: LUT, 263: carry logic, 265: FF, 280: RS, 300: memory circuit, 310: circuit, 311: transistor, 312: transistor, 313: transistor, 314: capacitor, 315: circuit, 400: memory circuit, 410: circuit, 411: transistor, 412: transistor, 413: capacitor, 414: transistor, 415: transistor, 416: capacitor, 417: transistor, 418: circuit, 419: circuit, 420: circuit, 421: inverter, 422: transistor, 500: memory circuit, 510: circuit, 511: transistor, 512: transistor, 513: transistor, 514: transistor, 515: transistor, 516: transistor, 520: circuit, 521: transistor, 522: transistor, 523: capacitor, and 524: capacitor.

This application is based on Japanese Patent Application Serial No. 2016-161049 filed with Japan Patent Office on Aug. 19, 2016, the entire contents of which are hereby incorporated by reference.

The invention claimed is:

1. A method for controlling a semiconductor device, comprising the steps of:
    performing arithmetic processing by a programmable logic device in accordance with an operation of a processor to obtain first data;
    inputting a signal to a state control circuit, wherein the signal corresponds to a state of progress of the arithmetic processing;
    inputting the first data to a nonvolatile memory circuit of the programmable logic device;
    holding second data corresponding to the signal in the state control circuit;
    detecting an end of the arithmetic processing by the second data held in the state control circuit; and
    turning off the programmable logic device after detecting the end of the arithmetic processing.

2. The method for controlling a semiconductor device according to claim 1, wherein the nonvolatile memory circuit is included in a register of the programmable logic device.

3. The method for controlling a semiconductor device according to claim 1, wherein a register of the programmable logic device further comprises a volatile memory circuit.

4. The method for controlling a semiconductor device according to claim 1, wherein the processor is configured to access the nonvolatile memory circuit through a bus.

5. The method for controlling a semiconductor device according to claim 1, wherein the nonvolatile memory circuit comprises any one of a flash memory, a ferroelectric random access memory, a magnetoresistive random access memory, a phase change random access memory, a resistive random access memory, and a transistor including an oxide semiconductor.

6. The method for controlling a semiconductor device according to claim 1,
    wherein the programmable logic device comprises a first programmable area and a second programmable area,
    wherein the first programmable area has a circuit configuration with which the state of progress of the arithmetic processing is detected, and
    wherein the second programmable area has a circuit configuration with which the arithmetic processing is performed.

7. A method for controlling a semiconductor device, comprising the steps of:
    performing arithmetic processing by a programmable logic device in accordance with an operation of a processor to obtain first data;
    inputting a signal to a state control circuit, wherein the signal corresponds to a state of progress of the arithmetic processing by the programmable logic device;
    inputting the first data to a first nonvolatile memory circuit of the programmable logic device;
    performing arithmetic processing by the processor to obtain second data;
    inputting the second data to a second nonvolatile memory circuit of the processor;
    holding third data corresponding to the signal in the state control circuit;
    detecting an end of the arithmetic processing by the programmable logic device by the second data held in the state control circuit;
    turning off the programmable logic device after detecting the end of the arithmetic processing by the programmable logic device; and
    turning off the processor by a power management unit after an end of the operation of the processor.

8. The method for controlling a semiconductor device according to claim 7, wherein the first nonvolatile memory circuit is included in a register of the programmable logic device.

9. The method for controlling a semiconductor device according to claim 7, wherein the processor is configured to access the first nonvolatile memory circuit through a bus.

10. The method for controlling a semiconductor device according to claim 7,
    wherein the programmable logic device comprises a first programmable area and a second programmable area,
    wherein the first programmable area has a circuit configuration with which the state of progress of the arithmetic processing by the programmable logic device is detected, and
    wherein the second programmable area has a circuit configuration with which the arithmetic processing by the programmable logic device is performed.

11. A method for controlling a semiconductor device, comprising the steps of:
    performing arithmetic processing by a programmable logic device to obtain first data;
    inputting a first signal to a state control circuit after the arithmetic processing is completed;
    producing second data in the state control circuit after receiving the first signal;
    inputting the first data to a nonvolatile memory circuit of the programmable logic device after producing the second data; and
    outputting a second signal using the second data in order to turn off the programmable logic device by a processor after inputting the first data.

12. The method for controlling a semiconductor device according to claim 11, wherein the state control circuit holds the first signal in a register of the state control circuit.

13. The method for controlling a semiconductor device according to claim 12, wherein the processor is configured to access the register of the state control circuit through a bus.

14. The method for controlling a semiconductor device according to claim 11, wherein the processor is configured to receive a third signal when the programmable logic device starts the arithmetic processing by the programmable logic device.

15. The method for controlling a semiconductor device according to claim 11, wherein a register of the programmable logic device comprises the nonvolatile memory circuit and a volatile memory circuit.

16. The method for controlling a semiconductor device according to claim 11, wherein the nonvolatile memory circuit comprises any one of a flash memory, a ferroelectric random access memory, a magnetoresistive random access memory, a phase change random access memory, a resistive random access memory, and a transistor including an oxide semiconductor.

* * * * *